United States Patent
Greene et al.

(10) Patent No.: US 10,454,452 B2
(45) Date of Patent: Oct. 22, 2019

(54) METHOD AND APPARATUS FOR HIGH EFFICIENCY RECTIFICATION FOR VARIOUS LOADS

(71) Applicant: Powercast Corporation, Ligonier, PA (US)

(72) Inventors: Charles E. Greene, Cabot, PA (US); Daniel W. Harrist, Carnegie, PA (US)

(73) Assignee: Powercast Corporation, Pittsburgh, PA (US)

( * ) Notice: Subject to any disclaimer, the term of this patent is extended or adjusted under 35 U.S.C. 154(b) by 950 days.

(21) Appl. No.: 14/679,784

(22) Filed: Apr. 6, 2015

(65) Prior Publication Data

US 2015/0214927 A1     Jul. 30, 2015

Related U.S. Application Data

(60) Division of application No. 12/951,367, filed on Nov. 22, 2010, now Pat. No. 9,000,616, which is a
(Continued)

(51) Int. Cl.
*H02J 50/20* (2016.01)
*H03H 11/28* (2006.01)
(Continued)

(52) U.S. Cl.
CPC ............. *H03H 11/28* (2013.01); *H02J 1/00* (2013.01); *H02J 1/10* (2013.01); *H02J 7/025* (2013.01); *H02J 7/32* (2013.01); *H02J 17/00* (2013.01); *H02J 50/20* (2016.02); *H02M 3/04* (2013.01); *H02M 7/04* (2013.01); *H02M 7/08* (2013.01); *H02M 7/103* (2013.01); *H05B 33/0809* (2013.01); *Y10T 307/707* (2015.04)

(58) Field of Classification Search
CPC ....................................................... H02J 50/20
See application file for complete search history.

(56) References Cited

U.S. PATENT DOCUMENTS

| | | |
|---|---|---|
| 3,114,517 A | 12/1963 | Brown |
| 3,434,678 A | 3/1969 | Brown et al. |

(Continued)

FOREIGN PATENT DOCUMENTS

| | | |
|---|---|---|
| DE | 10321162 A1 | 12/2003 |
| EP | 0520500 A2 | 12/1992 |

(Continued)

OTHER PUBLICATIONS

International Search Report and Written Opinion for International Application No. PCT/US06/41300, dated May 22, 2007, 10 pages.
(Continued)

*Primary Examiner* — Fritz M Fleming

(57) ABSTRACT

An apparatus for converting power includes at least one impedance matching network which receives an electrical signal. The apparatus includes at least one AC to DC converter in communication with the impedance matching network. Also disclosed is a method for powering a load and an apparatus for converting power and additional embodiments of an apparatus for converting power.

20 Claims, 20 Drawing Sheets

Related U.S. Application Data continuation of application No. 11/584,983, filed on Oct. 23, 2006, now Pat. No. 7,868,482.

(60) Provisional application No. 60/729,792, filed on Oct. 24, 2005.

(51) Int. Cl.

| | |
|---|---|
| *H02J 7/02* | (2016.01) |
| *H02J 1/10* | (2006.01) |
| *H02J 7/32* | (2006.01) |
| *H02M 7/08* | (2006.01) |
| *H02M 7/10* | (2006.01) |
| *H02J 1/00* | (2006.01) |
| *H02J 17/00* | (2006.01) |
| *H02M 3/04* | (2006.01) |
| *H02M 7/04* | (2006.01) |
| *H05B 33/08* | (2006.01) |

(56) References Cited

U.S. PATENT DOCUMENTS

| | | | | |
|---|---|---|---|---|
| 5,184,288 | A | 2/1993 | Washburn et al. | |
| 5,352,993 | A | 10/1994 | Mäder | |
| 5,610,452 | A | 3/1997 | Shimer et al. | |
| 6,140,924 | A | 10/2000 | Chia et al. | |
| 6,212,431 | B1 | 4/2001 | Hahn et al. | |
| 6,339,390 | B1 | 1/2002 | Velasquez et al. | |
| 6,615,074 | B2 | 9/2003 | Mickle et al. | |
| 6,794,951 | B2 | 9/2004 | Finley | |
| 6,822,426 | B1 | 11/2004 | Todd et al. | |
| 6,992,611 | B1 | 1/2006 | Lili et al. | |
| 7,446,485 | B2 | 11/2008 | Huang | |
| 7,868,482 | B2 | 1/2011 | Greene et al. | |
| 8,102,078 | B2 | 1/2012 | Ogram | |
| 8,106,636 | B2 | 1/2012 | Asinovski et al. | |
| 8,552,597 | B2 * | 10/2013 | Song | H02J 50/27 307/149 |
| 9,000,616 | B2 | 4/2015 | Greene et al. | |
| 9,973,008 | B1 * | 5/2018 | Leabman | H02J 50/20 |
| 2001/0048606 | A1 | 12/2001 | Mallory | |
| 2002/0111151 | A1 | 8/2002 | Irion et al. | |
| 2002/0190689 | A1 | 12/2002 | Nakamura et al. | |
| 2005/0186994 | A1 * | 8/2005 | Rahmel | H02J 50/00 455/572 |
| 2006/0199620 | A1 | 9/2006 | Greene et al. | |
| 2009/0067208 | A1 * | 3/2009 | Martin | H02J 50/20 363/126 |
| 2011/0175461 | A1 * | 7/2011 | Tinaphong | H02J 50/20 307/149 |

FOREIGN PATENT DOCUMENTS

| | | |
|---|---|---|
| EP | 1263114 A2 | 12/2002 |
| JP | S60 223476 A | 11/1985 |
| JP | 62-081488 U | 5/1987 |
| JP | 05-211771 | 8/1993 |
| JP | 06-103952 A | 4/1994 |
| JP | 409148974 A | 6/1997 |
| JP | 2002-034177 | 1/2002 |
| WO | WO2005/048476 A1 | 5/2005 |
| WO | WO2007/050519 A2 | 5/2007 |

OTHER PUBLICATIONS

Office Action dated Sep. 25, 2009 for Chinese Patent Application No. 200680039752.2.

Office Action dated Mar. 2, 2011 for Chinese Patent Application No. 200680039752.2, 6 pages.

Office Action dated Apr. 6, 2012 for Japanese Patent Application No. 2008-537843, 7 pages.

Office Action dated Feb. 3, 2014, for Japanese Patent Application No. 2008-537843.

Office Action dated Apr. 1, 2013 for Japanese Patent Application No. 2008-537843.

Examination Report for Australian Patent Application No. 2006306364, dated Jul. 16, 2012.

Office Action dated Dec. 11, 2014, for Canadian Patent Application No. 2,625,409.

Examination Report for Canadian Application No. 2,625,409, dated Nov. 1, 2013.

Final Office Action for Korean Patent Application No. 10-2008-7012452.

Office Action dated Feb. 19, 2013 for Korean Patent Application No. 10-2008-7012452.

Office Action for U.S. Appl. No. 12/951,367, dated Jul. 9, 2013.

Office Action for U.S. Appl. No. 12/951,367, dated May 9, 2014.

Office Action for U.S. Appl. No. 11/584,983, dated Sep. 21, 2009.

Soo-Seok Kiim, "A High Performance Parallel Operation Characteristic of ZVS FB PWM Converter Using Current Balance Method," PhD thesis, Hanyang University, Dec. 1998.

Office Action dated Nov. 27, 2015 for Indian Patent Application No. 3373/DELNP/2008.

Extended European Search Report for European Patent Application No. 06836468, dated Jan. 29, 2016.

Office Action for European Application No. 06 836 468.6, dated Jun. 21, 2019.

* cited by examiner

METHOD AND APPARATUS FOR HIGH EFFICIENCY RECTIFICATION FOR VARIOUS LOADS

CROSS-REFERENCE TO RELATED APPLICATIONS

This application claims priority to and is a divisional of U.S. patent application Ser. No. 12/951,367, filed Nov. 22, 2010, which claims priority to and is a continuation of U.S. patent application Ser. No. 11/584,983, filed Oct. 23, 2006 (now U.S. Pat. No. 7,868,482), which claims priority to and the benefit of U.S. Provisional Patent Application Ser. No. 60/729,792, filed Oct. 24, 2005; each of which is incorporated herein by reference in its entirety.

BACKGROUND

The present invention is related to a method and apparatus for converting power. More specifically, the present invention is related to a method and apparatus for converting power with an AC to DC converter.

The prior art has shown that it is possible to provide power to remote devices using Radio-Frequency (RF) electromagnetic waves. Wireless power transfer has been described in great detail by W. C. Brown in U.S. Pat. No. 3,114,517, "Microwave Operated Space Vehicles," incorporated by reference herein, and within numerous other articles by the stated author. Wireless power transfer is also used to provide power to Radio-Frequency Identification (RFID) tags. The transmitted RF power is captured by an antenna and rectified using a number of disclosed circuits to provide Direct Current (DC) to a load. U.S. Pat. No. 3,434,678, "Microwave to DC Converter," incorporated by reference herein, describes an apparatus for converting microwave power to DC using the bridge rectifying circuit shown in FIG. 1.

More recent patents such as U.S. Pat. No. 6,140,924, "Rectifying Antenna Circuit," and U.S. Pat. No. 6,615,074, "Apparatus for Energizing a Remote Station and Related Method," both incorporated by reference herein, describe RF to DC converters that are implemented using voltage doubling rectifier configurations as shown in FIG. 2.

The function of these circuits is acceptable when the input power and the load impedance are constant. However, variations in either the input power or load impedance degrade the overall conversion efficiency of the circuit. The conversion efficiency is defined as the rectified output DC power divided by the Alternating Current (AC) power input to the rectifier. Examples of how changes in the load resistance (or equivalent resistance) and input power affect the conversion efficiency are shown in FIGS. 3 and 4, respectively.

Changes in the rectifier conversion efficiency for varying input power and output load were described in U.S. Pat. No. 6,212,431, "Power Transfer Circuit for Implanted Devices," incorporated by reference herein, which teaches in Column 1 lines 55-62 that when transferring power inductively from an external coil to an implanted device that "Unfortunately, neither the load associated with the implant device nor the separation distance between the external coil and the implant coil are constants. Each of these parameters are, in practice, variables, that may vary, e.g., from 3-to-15 mm for the separation distance, and 20 to 300 ohms for the load. As a result, optimum power transfer between the external device and implant device is rarely achieved. Thus, a less than optimum power transfer condition exists . . . " In this quotation, the separation distance is analogous to changing the input power to the implanted device. The solution proposed in U.S. Pat. No. 6,212,431 is to vary a matching parameter on the external transmitting coil to optimize the power transfer from the external transmitting coil to the implanted receiving coil. The invention disclosed in U.S. Pat. No. 6,212,431 implements the solution at the transmitter, which limits the system to one receiver because the transmitter must vary its output based on a single receiver. Also, U.S. Pat. No. 6,212,431 makes no mention of a rectifying circuit and the effect this may have on the method and apparatus presented. Additionally, U.S. Pat. No. 6,212,431 relies on inductive coupling, which allows the impedance of the implanted device to be seen by the transmitting coil in a similar manner of reflecting the impedance on the secondary side of a transformer to the primary side. The invention described herein does not rely solely on inductive or near-field power transfer, but rather includes operation in the far-field where reflecting the receiving load to the transmitting side is not possible.

Varying load impedances are also examined in U.S. Pat. No. 6,794,951, incorporated by reference herein, which describes a transmitting circuit to ionize gas to create a plasma. The problem presented is that the load seen by the transmitter changes depending on the status of the plasma in the chamber. When no plasma is present, the transmitter sees a certain impedance value. However, when there is plasma present in the chamber, a different impedance value is seen by the transmitter. To combat this issue, U.S. Pat. No. 6,794,951 proposes a dual impedance matching circuit, which is controlled via a switch selection system. During the start mode, the first impedance matching circuit is used to match when no plasma is present in the chamber. During the run mode, the second impedance matching circuit is used to match the system with plasma in the chamber. The solution presents a way to drive discrete load values on an RF transmitter. This solution is limited to the transmitting side, must know the discrete impedance values seen during the multiple modes in order to design the impedance matching networks, must have active switching to control the matching network, and is designed to give an RF output.

SUMMARY

The present invention pertains to an apparatus for converting power. The apparatus comprises at least one impedance matching network which receives an electrical signal. The apparatus comprises a plurality of AC to DC converters in communication with the impedance matching network.

The present invention pertains to a method for powering a load. The method comprises the steps of receiving an electrical signal at an impedance matching network. There is the step of converting the signal at a plurality of AC to DC converters in communication with the impedance matching network. There is the step of providing current to the load in communication with the plurality of AC to DC converters.

The present invention pertains to an apparatus for converting power. The apparatus comprises an energy harvester for harvesting a signal including at least one AC to DC converter which provides a conversion efficiency of the signal of at least 50% for a resistive load range that covers at least 100 times the minimum value.

The present invention pertains to an apparatus for converting power. The apparatus comprises an energy harvester for harvesting a signal including at least one AC to DC converter which provides a conversion efficiency of the signal of at least 50% when charging or recharging a charge storage device for an input power range that covers at least 20 dB.

The present invention pertains to an apparatus for converting power. The apparatus comprises means for harvesting a signal including means for converting AC to DC which provides a conversion efficiency of the signal of at least 50% when charging or recharging a charge storage device for an input power range that covers at least 20 dB.

The present invention pertains to an apparatus for converting power. The apparatus comprises an energy harvester for harvesting a signal including at least one AC to DC converter which provides a conversion efficiency of the signal of at least 50% for an input power range that covers at least 20 dB.

The present invention pertains to an apparatus for converting power. The apparatus comprises at least two first impedance matching networks which receive an electrical signal. The apparatus comprises at least one AC to DC converter in communication with the first impedance matching networks. The apparatus comprises a combiner in electrical communication with the first matching networks.

The present invention pertains to an apparatus for converting power. The apparatus comprises an energy harvester including at least one AC to DC converter. The apparatus comprises at least two non-linear elements, wherein the at least two non-linear elements have different characteristics.

The present invention pertains to an apparatus for converting power. The apparatus comprises an energy harvester including at least one AC to DC converter which provides a conversion efficiency of an input signal having at least two peaks in efficiency.

The present invention pertains to an apparatus for converting power. The apparatus comprises an energy harvester including at least one AC to DC converter which provides a conversion efficiency of an input signal of at least 50% for a range from a predetermined distance to ten times the distance.

The present invention pertains to an apparatus for converting power. The apparatus comprises an energy harvester including at least one AC to DC converter configured to receive a first input power at a first distance with a first efficiency, wherein the AC to DC converter receives a second input power at a second distance with a second efficiency. The first distance is greater than the second distance, and the first efficiency is substantially similar to the second efficiency.

The present invention pertains to an apparatus for converting power. The apparatus comprises an energy harvester including at least one AC to DC converter which provides an input SWR of less than 2.0 for an input power range of at least 16 dB.

The present invention pertains to an apparatus for converting power. The apparatus comprises an energy harvester including at least one AC to DC converter which provides an input SWR of less than 2.0 for a resistive load range that covers at least 40 times a predetermined minimum value.

The present invention pertains to an apparatus for converting power. The apparatus comprises an energy harvester including at least one AC to DC converter wherein the output resistance of the AC to DC converter varies in response to changes in input power or load resistance.

The present invention pertains to an apparatus for converting power. The apparatus comprises an energy harvester including at least one AC to DC converter which provides a conversion efficiency of an input signal of at least 50% for an input power range that covers at least 20 dB.

The present invention pertains to an apparatus for converting power. The apparatus comprises an input interface and at least one AC to DC converter which provides a conversion efficiency of an input signal of at least 50% for a resistive load range that covers at least 100 times a predetermined minimum value.

The present invention pertains to an apparatus for converting power. The apparatus comprises an input interface and at least one AC to DC converter which provides a conversion efficiency of an input signal of at least 50% when charging or recharging a charge storage device for an input power range that covers at least 20 dB.

The present invention pertains to an apparatus for converting power. The apparatus comprises means for harvesting an input signal including means for converting AC to DC which provides a conversion efficiency of the input signal of at least 50% when recharging a charge storage device for an input power range that covers at least 20 dB.

The present invention pertains to an apparatus for converting power. The apparatus comprises at least two first impedance matching networks which receive an electrical signal. The apparatus comprises a combiner in electrical communication with the first matching networks. The apparatus comprises at least one AC to DC converter in communication with the first impedance matching networks through the combiner.

The present invention pertains to an apparatus for converting power. The apparatus comprises an input interface and at least one AC to DC converter. The apparatus comprises at least two non-linear elements, wherein the at least two non-linear elements have different characteristics.

The present invention pertains to an apparatus for converting power. The apparatus comprises an input interface and at least one AC to DC converter which provides a conversion efficiency of an input signal having at least two peaks in efficiency.

The present invention pertains to an apparatus for converting power. The apparatus comprises an input interface and at least one AC to DC converter which provides a conversion efficiency of an input signal of at least 50% for a range from a predetermined distance to ten times the distance.

The present invention pertains to an apparatus for converting power. The apparatus comprises an input interface and at least one AC to DC converter configured to receive a first input power at a first distance with a first efficiency, wherein the AC to DC converter receives a second input power at a second distance with a second efficiency. The first distance is greater than the second distance, and the first efficiency is substantially similar to the second efficiency.

The present invention pertains to an apparatus for converting power. The apparatus comprises an input interface and at least one AC to DC converter which provides an input SWR of less than 2.0 for an input power range of over 16 dB.

The present invention pertains to an apparatus for converting power. The apparatus comprises an input interface and at least one AC to DC converter which provides an input SWR of less than 2.0 for a resistive load range that covers at least 40 times a predetermined minimum value.

The present invention pertains to an apparatus for converting power. The apparatus comprises an input interface and at least one AC to DC converter wherein the output resistance of the AC to DC converter varies in response to changes in input power or load resistance.

The present invention pertains to an apparatus for converting power. The apparatus comprising an input interface and at least one AC to DC converter which provides a conversion efficiency having at least two peaks in efficiency versus load resistance.

The present invention pertains to an apparatus for converting power. The apparatus comprising an input interface and at least one AC to DC converter which provides a conversion efficiency having at least two peaks in efficiency versus output current.

The present invention pertains to an apparatus for converting power. The apparatus comprises an energy harvester including at least one AC to DC converter which provides a conversion efficiency having at least two peaks in efficiency versus load resistance.

The present invention pertains to an apparatus for converting power. The apparatus comprises an energy harvester including at least one AC to DC converter which provides a conversion efficiency having at least two peaks in efficiency versus output current.

DETAILED DESCRIPTION

Figure 1:
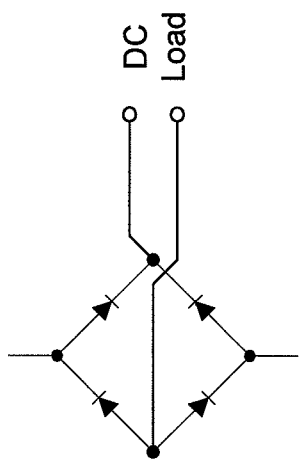
FIG. 1 is a schematic representation of a prior art bridge rectifier circuit.

A complete understanding of the invention will be obtained from the following description when taken in connection with the accompanying drawing figures wherein like reference characters identify like parts throughout.

For purposes of the description hereinafter, the terms "upper", "lower", "right", "left", "vertical", "horizontal", "top", "bottom", and derivatives thereof shall relate to the invention as it is oriented in the drawing figures. However, it is to be understood that the invention may assume various alternative variations and step sequences, except where expressly specified to the contrary. It is also to be understood that the specific devices and processes illustrated in the attached drawings, and described in the following specification, are simply exemplary embodiments of the invention. Hence, specific dimensions and other physical characteristics related to the embodiments disclosed herein are not to be considered as limiting.

Figure 9:
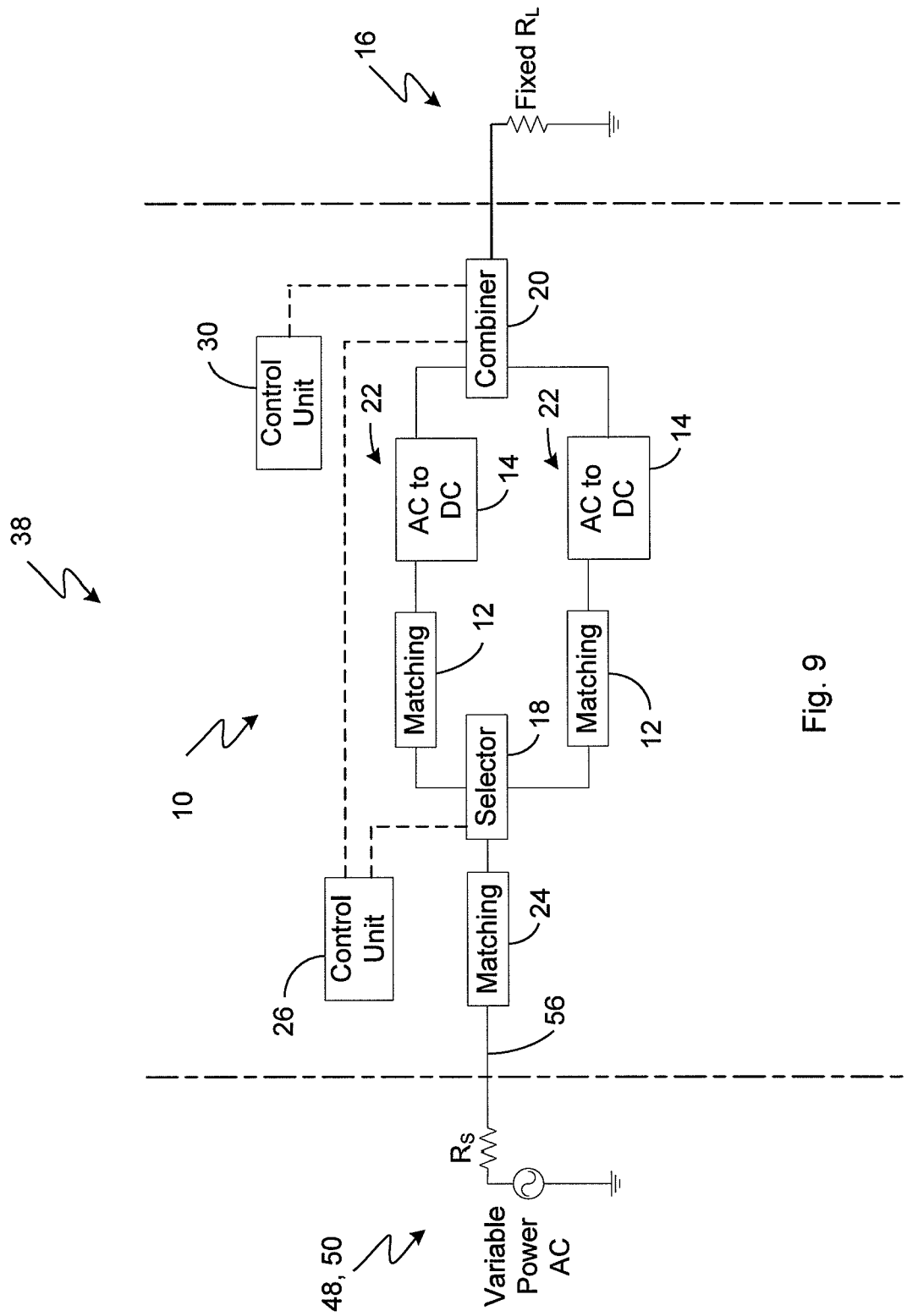
FIG. 9 is a block diagram of the present invention with a fixed load and a variable input power.

Referring now to the drawings wherein like reference numerals refer to similar or identical parts throughout the several views, and more specifically to FIG. 9 thereof, there is shown an apparatus 10 for converting power. The apparatus 10 comprises at least one first impedance matching network 12 which receives an electrical signal. The apparatus 10 comprises a plurality of AC to DC converters 14 in communication with the first impedance matching network 12 and configured to be communicable with a load 16, wherein the apparatus 10 is configured to be communicable with an input.

Preferably, there is a plurality of first impedance matching networks 12 in communication with the plurality of the AC to DC converters 14. The apparatus 10 preferably includes a selector 18 for directing the signal to the first impedance matching networks 12. Preferably, the selector 18 is active or passive.

The apparatus 10 preferably includes a combiner 20 connected to the plurality of AC to DC converters 14 for combining outputs of the AC to DC converters 14. Preferably, the combiner 20 is active or passive. The plurality of AC to DC converters 14 preferably define a plurality of AC to DC paths 22, where each path is optimized for a given characteristic. The apparatus 10 can include a second impedance matching network 24 that is configured to match an impedance of the apparatus 10 with an impedance of the input. Preferably, each AC to DC path 22 is matched to a predetermined impedance value. Each AC to DC path 22 preferably has a different output resistance. Each AC to DC converter 14 input can be matched to a predetermined impedance value at different input power levels using the at least one first impedance matching network 12.

In an embodiment when the selector 18 is active, there can be a selector control unit 26 that selects the appropriate AC to DC converter 14 based on input power level or load 16 resistance. There can be a combiner 20 connected to the plurality of AC to DC converters 14 and for combining outputs of the AC to DC converters 14, wherein the combiner 20 is active and including a combiner control unit 30. The selector 18 control unit and the combiner 20 control unit can be the same control unit.

In another embodiment, one of the AC to DC converters' 14 output resistance is designed to be at or near one discrete resistance that the load 16 is at or near for some time; and another of the AC to DC converters' 14 output resistance is designed to be at or near a different discrete resistance that the load 16 is at or near for some other time.

Each of the AC to DC converters 14 can have a different output resistance corresponding to an associated optimal load 16. One of the AC to DC converters' 14 input impedance can be matched to a predetermined value at one power level, and another of the AC to DC converters' 14 input impedance is matched to another predetermined value at a different power level.

Figure 15:
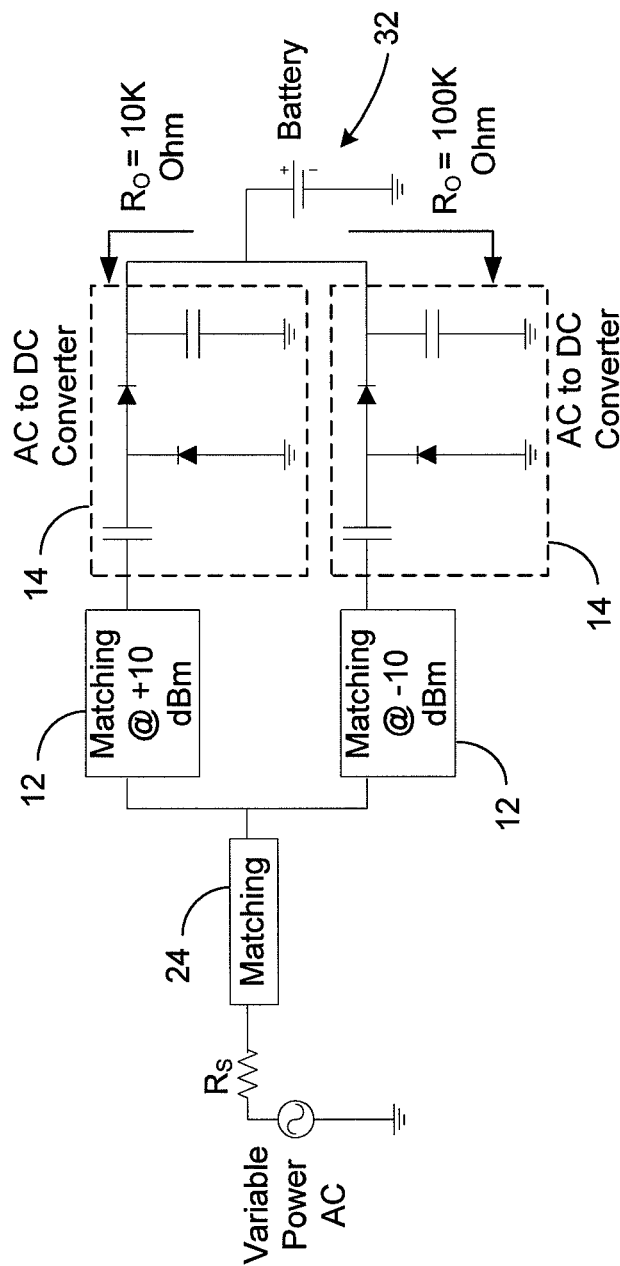
FIG. 15 is a block diagram of the present invention used to charge or recharge a battery at a near optimal conversion efficiency over a wide range of input power levels.
Figure 16:
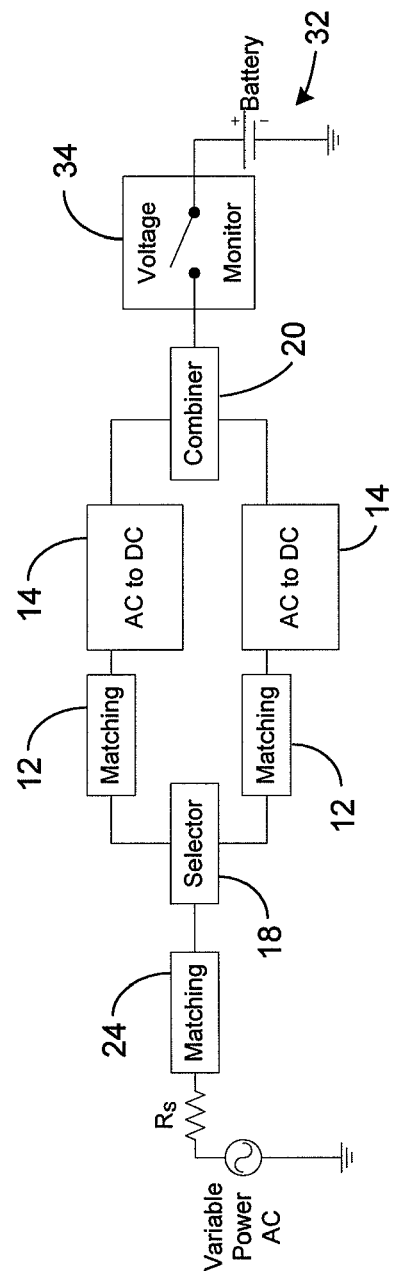
FIG. 16 is a block diagram of the present invention with voltage monitoring circuitry after the combiner.

The load can be a battery 32 to which each AC to DC converter 14 is in electrical communication with and each AC to DC path 22 is optimized for a specific input power level and load 16 resistance, as shown in FIG. 15. There can be a voltage monitoring circuit 34 connected between the plurality of AC to DC converters 14 and the battery 32 and insures that a voltage level stays within a specified range, as shown in FIG. 16. There can be a printed circuit board 36 on which the plurality of AC to DC converters 14 and the at least one first matching network are disposed.

Figure 19:
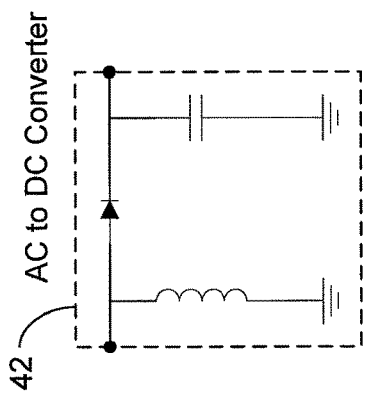
FIG. 19 is a block diagram of a single diode, full waved rectifier use with the present invention.
Figure 20:
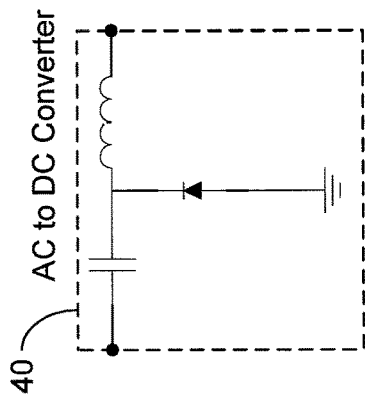
FIG. 20 is a block diagram of a single diode, halfwave rectifier used with the present invention.
Figure 25:
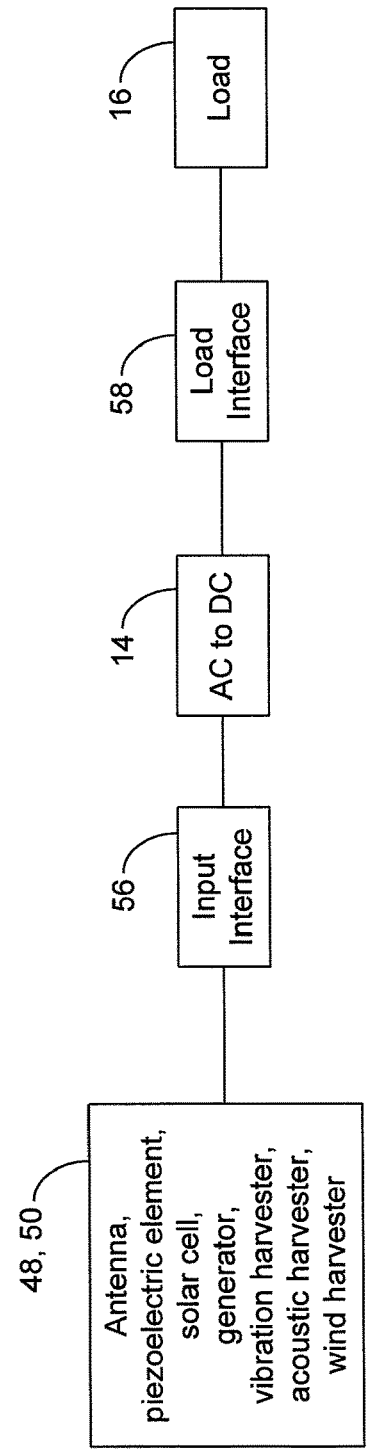
FIG. 25 is another embodiment of the present invention.

In yet another embodiment, the apparatus 10 is included in an energy harvester 38 that produces the electrical signal. The energy harvester 38 can include an antenna 48, a piezoelectric element 50, a solar cell, a generator, a vibration harvester, an acoustic harvester or a wind harvester, as shown in FIG. 25. Furthermore, the antenna 48, the piezoelectric element 50, the solar cell, the generator, the vibration harvester, the acoustic harvester or the wind harvester may be coupled to at least one AC to DC converter 14 via an input interface 56 and the at least one AC to DC converter 14 may be coupled to a load 16 via a load interface 58, as shown in FIG. 25. At least one of the plurality of AC to DC converters 14 can be either a single diode full wave rectifier 40 or a single diode half wave rectifier 42, as shown in FIGS. 19 and 20, respectively. At least one of the plurality of AC to DC converters 14 can be a voltage doubler.

Figure 10:
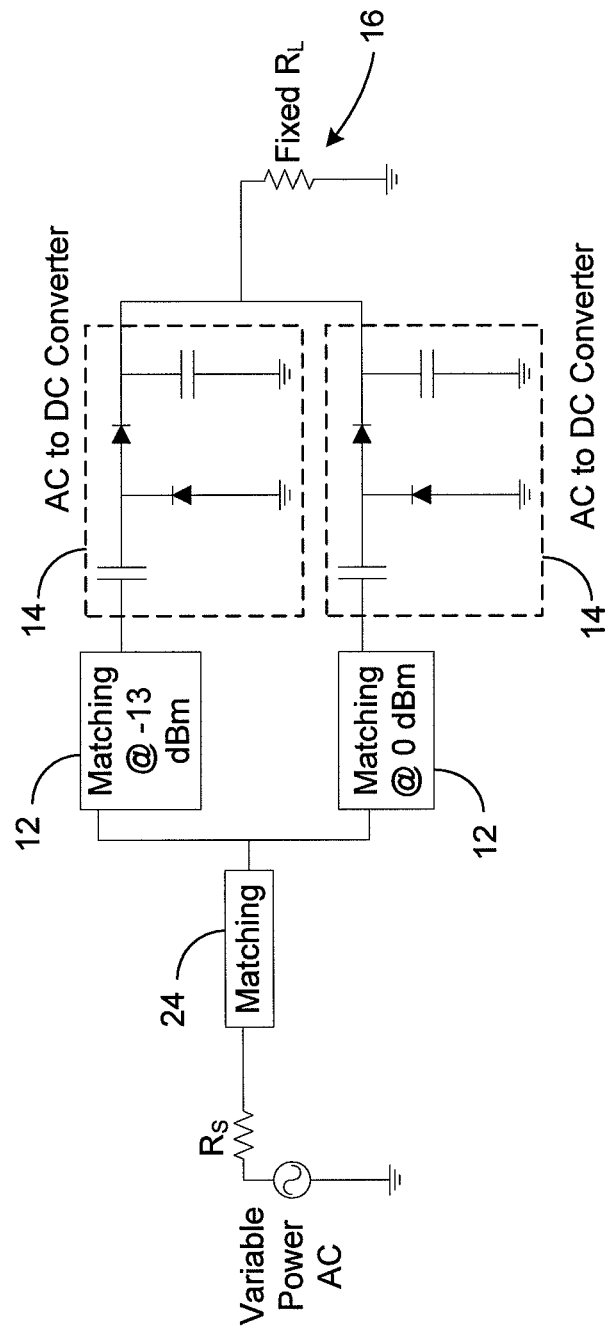
FIG. 10 is a block diagram of a fixed load at the optimal value with a variable input power when using passive selector and combiner blocks.
Figure 11:
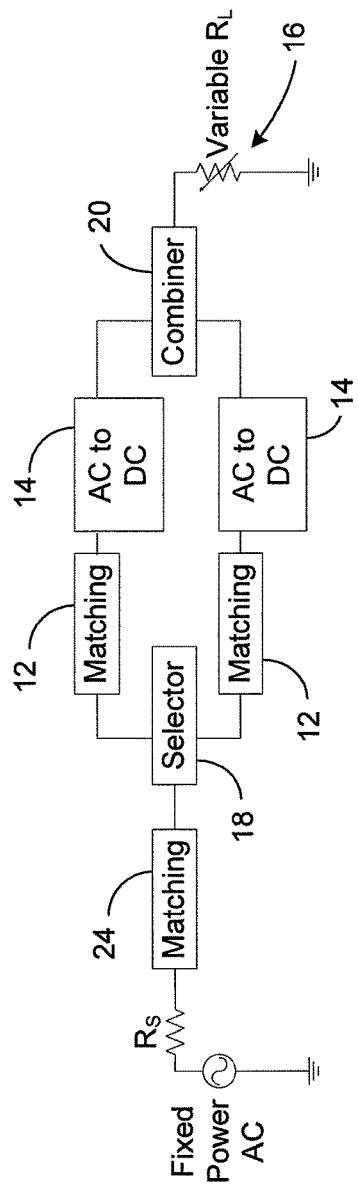
FIG. 11 is a block diagram of the present invention with a variable load and a fixed input power.
Figure 13:
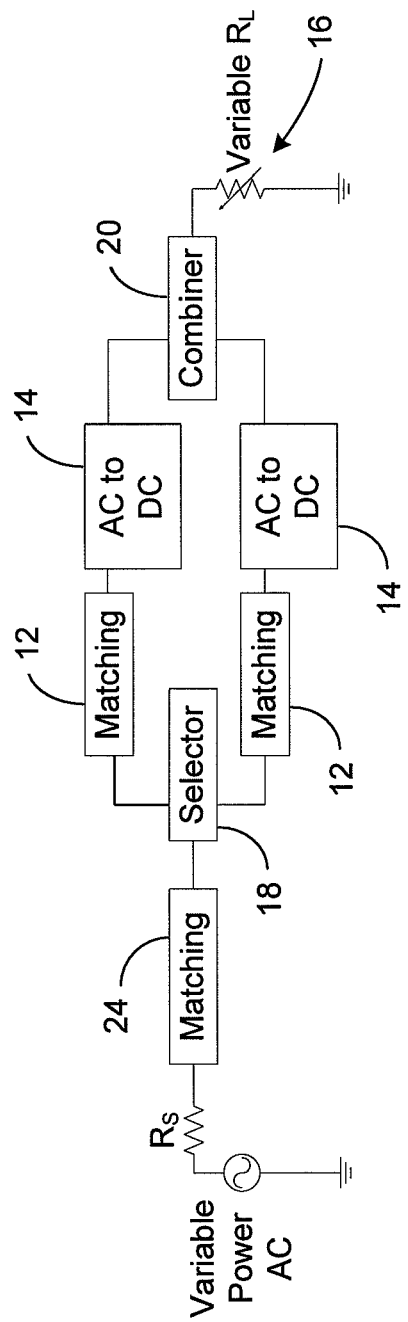
FIG. 13 is a block diagram of the present invention with a variable load and a variable input power.

The load 16 can include at least one power storage element 44 in electrical communication with at least one of the AC to DC converters 14. The load 16 can be fixed at or near the load's 16 optimal resistance, and the electrical signal provides an input power that is variable, as shown in FIG. 10. The load 16 can be variable and the electrical signal provides an input power that is fixed, as shown in FIG. 11. Alternatively, the load 16 is variable and the electrical signal provides an input power that is variable, as shown in FIG. 13. The load 16 can be an LED.

The present invention pertains to a method for powering a load 16. The method comprises the steps of receiving an electrical signal at an impedance matching network. There is the step of converting the signal at a plurality of AC to DC converters 14 in communication with the impedance matching network. There is the step of providing current to the load 16 in communication with the plurality of AC to DC converters 14.

Preferably, the receiving step includes the step of receiving the electrical signal at a plurality of impedance matching networks in communication with the plurality of the AC to DC converters 14. There is preferably the step of directing the signal with a selector 18. Preferably, the selector 18 is active or passive.

There can be the step of combining outputs from the plurality of AC to DC converters 14 with a combiner 20 connected to the load 16. Preferably, the combiner 20 is active or passive.

The present invention pertains to an apparatus 10 for converting power. The apparatus 10 comprises an energy harvester 38 including at least one AC to DC converter 14 which provides a conversion efficiency of an input signal of at least 50% for an input power range that covers at least 20 dB.

Preferably, the AC to DC converter 14 is used in an energy harvester 38. The energy harvester 38 can include an antenna 48. Alternatively, the energy harvester 38 can include a piezoelectric element 50.

The present invention pertains to an apparatus 10 for converting power. The apparatus 10 comprises an energy harvester 38 including at least one AC to DC converter 14 which provides a conversion efficiency of an input signal of at least 50% for a resistive load 16 range that covers at least 100 times a predetermined minimum value.

The present invention pertains to an apparatus 10 for converting power. The apparatus 10 comprises an energy harvester 38 including at least one AC to DC converter 14 which provides a conversion efficiency of an input signal of at least 50% when recharging a charge storage device for an input power range that covers at least 20 dB.

The present invention pertains to an apparatus 10 for converting power. The apparatus 10 comprises means for harvesting an input signal including means for converting AC to DC which provides a conversion efficiency of the input signal of at least 50% when recharging a charge storage device for an input power range that covers at least 20 dB. The means for converting AC to DC can be an AC to DC converter 14. The means for harvesting a signal can be an energy harvester 38.

Figure 12:
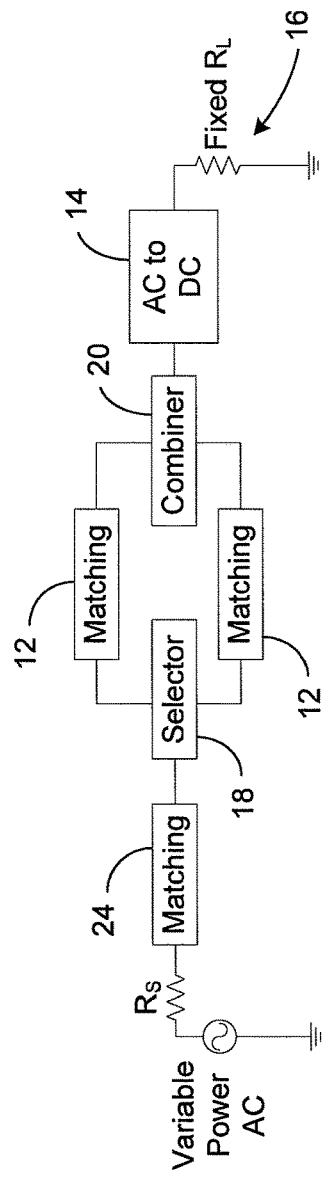
FIG. 12 is a block diagram of one AC to DC converter with two matching networks used for active selection by the selector block.

The present invention pertains to an apparatus 10 for converting power, as shown in FIG. 12. The apparatus 10 comprises at least two first impedance matching networks 12 which receive an electrical signal. The apparatus 10 comprises a combiner 20 in electrical communication with the first matching networks. The apparatus 10 comprises at least one AC to DC converter 14 in communication with the first impedance matching networks 12 through the combiner 20. Preferably, the combiner 20 is a switch.

The present invention pertains to an apparatus 10 for converting power. The apparatus 10 comprises an energy harvester 38 including at least one AC to DC converter 14. The apparatus 10 comprises at least two non-linear elements, wherein the at least two non-linear elements have different characteristics.

Preferably, the at least two non-linear elements are one or more of diodes, mosfets, or transistors. The different characteristics preferably include different impedances or different resistances.

The present invention pertains to an apparatus 10 for converting power. The apparatus 10 comprises an energy harvester 38 including at least one AC to DC converter 14 which provides a conversion efficiency of an input signal having at least two peaks in efficiency.

The present invention pertains to an apparatus 10 for converting power. The apparatus 10 comprises an energy harvester 38 including at least one AC to DC converter 14 which provides a conversion efficiency of an input signal of at least 50% for a range from a predetermined distance to ten times the distance.

The present invention pertains to an apparatus 10 for converting power. The apparatus 10 comprises an energy harvester 38 including at least one AC to DC converter 14 configured to receive a first input power at a first distance with a first efficiency, wherein the AC to DC converter 14 receives a second input power at a second distance with a second efficiency. The first distance is greater than the second distance, and the first efficiency is substantially similar to the second efficiency.

Preferably, the first input power and the second input power are formed by pulses of power.

The present invention pertains to an apparatus 10 for converting power. The apparatus 10 comprises an energy harvester 38 including at least one AC to DC converter 14 which provides an input SWR of less than 2.0 for an input power range of at least 16 dB.

The present invention pertains to an apparatus 10 for converting power. The apparatus 10 comprises an energy harvester 38 including at least one AC to DC converter 14 which provides an input SWR of less than 2.0 for a resistive load 16 range that covers at least 40 times a predetermined minimum value.

The present invention pertains to an apparatus 10 for converting power. The apparatus 10 comprises an energy harvester 38 including at least one AC to DC converter 14 wherein the output resistance of the AC to DC converter 14 varies in response to changes in input power or load 16 resistance.

The apparatus 10 preferably includes a voltage monitoring circuit 34 that insures that a voltage level stays within a specified range.

The present invention pertains to an apparatus 10 for converting power. The apparatus 10 comprises an energy harvester 38 including at least one AC to DC converter 14 which provides a conversion efficiency of an input signal of at least 50% for an input power range that covers at least 20 dB.

Preferably, the AC to DC converter 14 is used in an energy harvester 38. The energy harvester 38 can include an antenna 48. Alternatively, the energy harvester 38 can include a piezoelectric element 50.

The present invention pertains to an apparatus 10 for converting power. The apparatus 10 comprises an input interface and at least one AC to DC converter 14 which provides a conversion efficiency of an input signal of at least 50% for a resistive load 16 range that covers at least 100 times a predetermined minimum value. An input interface may be a connector, wire, pin, lead, or any other suitable element that can accept the input signal.

The present invention pertains to an apparatus 10 for converting power. The apparatus 10 comprises an input interface and at least one AC to DC converter 14 which provides a conversion efficiency of an input signal of at least 50% when recharging a charge storage device for an input power range that covers at least 20 dB.

The present invention pertains to an apparatus 10 for converting power. The apparatus 10 comprises means for harvesting an input signal including means for converting AC to DC which provides a conversion efficiency of the input signal of at least 50% when recharging a charge storage device for an input power range that covers at least 20 dB.

The present invention pertains to an apparatus 10 for converting power. The apparatus 10 comprises at least two first impedance matching networks 12 which receive an electrical signal. The apparatus 10 comprises at least one AC to DC converter 14 in communication with the first impedance matching networks 12. The apparatus 10 comprises a combiner 20 in electrical communication with the first matching networks. Preferably, the combiner 20 is a switch.

The present invention pertains to an apparatus 10 for converting power. The apparatus 10 comprises an input interface and at least one AC to DC converter 14. The apparatus 10 comprises at least two non-linear elements, wherein the at least two non-linear elements have different characteristics. Preferably, the at least two non-linear elements are one or more of diodes, mosfets, or transistors. The different characteristics preferably include different impedances or different resistances.

The present invention pertains to an apparatus 10 for converting power. The apparatus 10 comprises an input interface and at least one AC to DC converter 14 which provides a conversion efficiency of an input signal having at least two peaks in efficiency.

The present invention pertains to an apparatus 10 for converting power. The apparatus 10 comprises an input interface and at least one AC to DC converter 14 which provides a conversion efficiency of an input signal of at least 50% for a range from a predetermined distance to ten times the distance.

The present invention pertains to an apparatus 10 for converting power. The apparatus 10 comprises an input interface and at least one AC to DC converter 14 configured to receive a first input power at a first distance with a first efficiency, wherein the AC to DC converter 14 receives a second input power at a second distance with a second efficiency. The first distance is greater than the second distance, and the first efficiency is substantially similar to the second efficiency. Preferably, the first input power and the second input power are formed by pulses of power.

The present invention pertains to an apparatus 10 for converting power. The apparatus 10 comprises an input interface and at least one AC to DC converter 14 which provides an input SWR of less than 2.0 for an input power range of at least 16 dB.

The present invention pertains to an apparatus 10 for converting power. The apparatus 10 comprises an input interface and at least one AC to DC converter 14 which provides an input SWR of less than 2.0 for a resistive load 16 range that covers at least 40 times a predetermined minimum value.

The present invention pertains to an apparatus 10 for converting power. The apparatus 10 comprises an input interface and at least one AC to DC converter 14 wherein the output resistance of the AC to DC converter 14 varies in response to changes in input power or load 16 resistance. The apparatus 10 preferably includes a voltage monitoring circuit 34 that insures that a voltage level stays within a specified range.

The present invention pertains to an apparatus for converting power. The apparatus comprising an input interface and at least one AC to DC converter which provides a conversion efficiency having at least two peaks in efficiency versus load resistance.

The present invention pertains to an apparatus for converting power. The apparatus comprising an input interface and at least one AC to DC converter which provides a conversion efficiency having at least two peaks in efficiency versus output current.

The present invention pertains to an apparatus for converting power. The apparatus comprises an energy harvester including at least one AC to DC converter which provides a conversion efficiency having at least two peaks in efficiency versus load resistance.

The present invention pertains to an apparatus for converting power. The apparatus comprises an energy harvester including at least one AC to DC converter which provides a conversion efficiency having at least two peaks in efficiency versus output current.

The present invention discloses a method and apparatus 10 that provides a far superior solution for efficiently converting AC to DC for varying loads and input power levels than the prior art. Efficient conversion from AC to DC in this case is defined as being greater than fifty (50) percent; however, different applications may have different definitions. The invention can be applied not only to the inductive (near field) but also to the far field region. The far field region is commonly defined as $$r \geq \frac{2D^2}{\lambda}$$

where r is the distance between the transmitting and receiving antennas 48, D is the maximum dimension of either the transmitting or receiving antenna 48, and lambda is the wavelength. The invention is implemented in the AC to DC circuitry to allow multiple devices to operate from a single power transmitter unlike the referenced prior art, which implements solutions on the transmitting side.

Figure 2:
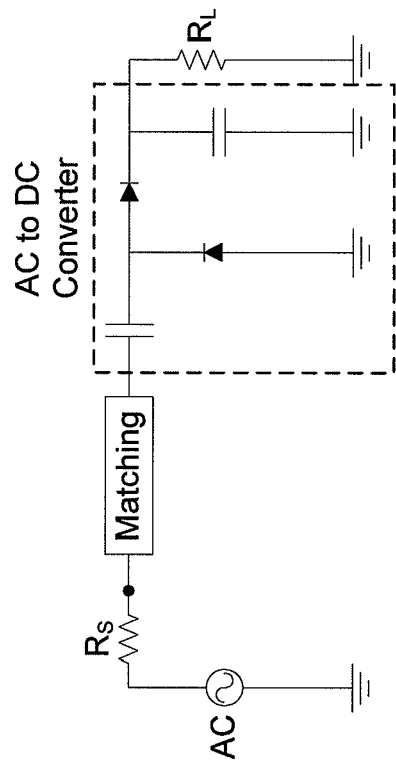
FIG. 2 is a schematic representation of a prior art voltage doubling rectifier.
Figure 5:
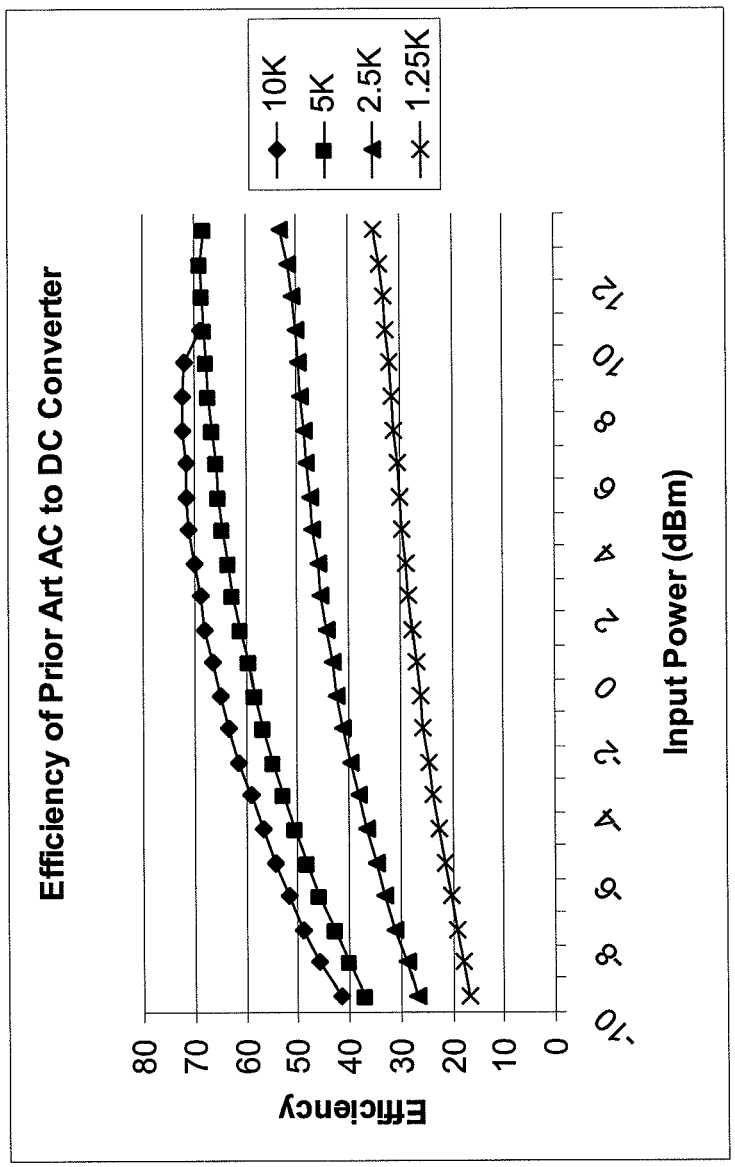
FIG. 5 is a graph of prior art DC to DC converter efficiency with various resistive loads.

When examining the prior art, the circuit shown in FIG. 2 when designed properly is able to drive a fixed resistive load 16 over a limited input power range with minimal effect on the equivalent impedance of the AC to DC converter 14 and load 16. However, when the load 16 is changed the conversion efficiency is reduced. Significant reductions are considered those that reduce the efficiency by 2 or more percent and/or reduce the AC to DC conversion efficiency below the application specific threshold such as fifty percent conversion efficiency. As an example, the circuit in FIG. 2 was constructed with a potentiometer as the load 16. The input was matched to 50-ohms and was connected to an RF network analyzer. The AC to DC conversion efficiency was then measured for various input power levels for a potentiometer setting of 10 k-ohm, 5 k-ohm, 2.5 k-ohm, and 1.25 k-ohm. The results seen in FIG. 5 show that a change from the optimal load 16 of 10 k-ohm to 5 k-ohm reduces the AC to DC conversion efficiency at 0 dBm (dBm is decibels referenced to 1 milliwatt) from 66.25 percent to 59.58 percent, respectively. The reduction is far greater for a change from 10 k-ohm to 2.5 k-ohm, which reduces the AC to DC conversion efficiency at 0 dBm from 66.25 percent to 43.18 percent, respectively. The reduction is even more dramatic for a change from 10 k-ohm to 1.25 k-ohm, which reduces the AC to DC conversion efficiency at 0 dBm from 66.25 percent to 26.91 percent, respectively.

Figure 6:
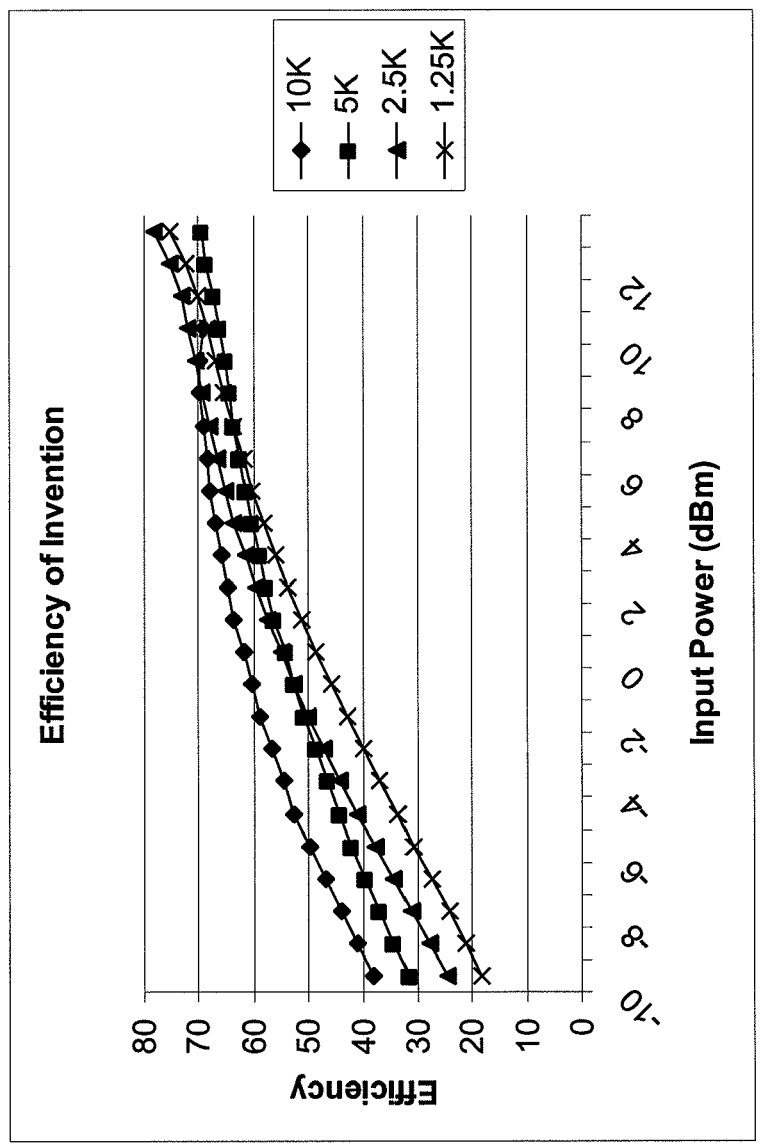
FIG. 6 is a graph of AC to DC conversion efficiency of the present invention with various resistive loads.

The invention described herein, however, does not have an AC to DC conversion efficiency that is as significantly affected by the load 16 resistance as the prior art shown in FIG. 5. To illustrate this, the invention was also measured with a potentiometer as the load 16 with settings of 10 k-ohm, 5 k-ohm, 2.5 k-ohm, and 1.25 k-ohm. The results are shown in FIG. 6, which illustrates that a change from the optimal load 16 of 10 k-ohm to 5 k-ohm reduces the AC to DC conversion efficiency at 0 dBm from 61.75 percent to only 54.19 percent, respectively. The change from 10 k-ohm to 2.5 k-ohm reduces the AC to DC conversion efficiency at 0 dBm from 61.75 percent to 54.94 percent, respectively. The change from 10 k-ohm to 1.25 k-ohm reduces the AC to DC conversion efficiency at 0 dBm from 61.75 percent to 48.42 percent, respectively. As can be seen, the invention has a slightly lower AC to DC conversion efficiency at the optimal load 16 resistance at 0 dBm, however, the AC to DC conversion efficiencies at other loads 16 remain higher than the prior art specifically at the lowest value of the load 16 resistance, 1.25 k-ohm. The invention also significantly outperforms the prior art at power levels above 0 dBm.

The reduction in conversion efficiency shown in FIG. 5 is magnified when a battery 32 or other power storage element 44 such as a large capacitor or LED is connected to the AC to DC converter 14 for the purpose of recharging or powering. The battery 32, power storage element 44, or LED holds a fairly constant voltage and therefore changes in input power power result in changes in the output current, which changes the equivalent resistance seen at the output of the AC to DC converter 14. The equivalent resistance is defined as the output voltage divided by the output current. As an example, if one milliwatt (1 mW) is input to an AC to DC converter 14 connected to a 3-volt battery 32 and the AC to DC conversion efficiency is 50 percent, the equivalent load 16 seen by the AC to DC converter 14 is given by $$R_{EQ} = \frac{V_B}{I_B} = \frac{V_B^2}{eP_{IN}} = \frac{V_B^2}{P_{OUT}}$$

where $V_B$ is the battery 32 voltage, $1_B$ is the current through the battery 32, e is the AC to DC conversion efficiency, $P_{IN}$ is the input power to the AC to DC converter 14, and $P_{OUT}$ is the output power from the AC to DC converter 14. For this example, the equivalent resistance is 18 k-ohm. However, if the input power is changed to two milliwatts (2 mW) and the conversion efficiency remains 50 percent the equivalent resistance is reduced to 9 k-ohm. Using this example, it can be seen that the equivalent load 16 resistance is inversely proportional to the input power to the AC to DC converter 14.

Figure 7:
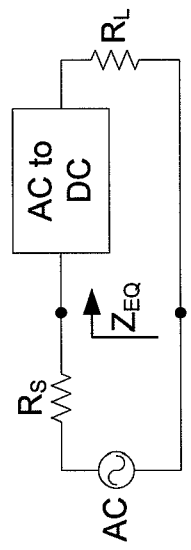
FIG. 7 is a schematic representation of a simplified equivalent circuit for the input of an AC to DC converter.

The changes in conversion efficiency for AC to DC converters 14 can be broken into two categories. First, power can be lost (reflected) when the equivalent impedance of the AC to DC converter 14 and load 16, $Z_{EQ}$, is not the complex conjugate of the source impedance. An example is shown in FIG. 7. This loss can be seen by examining the Maximum Power Transfer Theorem, which is well known to those skilled in the art. The Maximum Power Transfer Theorem states that the maximum power is transferred from the source to the load 16 when the source and load 16 impedance are complex conjugates.

Figure 8:
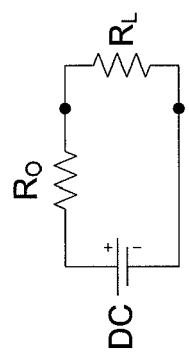
FIG. 8 is a schematic representation of a simplified equivalent circuit for the output of an AC to DC converter.

The second form of efficiency loss is caused by mismatch between the DC output resistance of the AC to DC converter 14 and the load 16 resistance. For the purpose of this invention, impedance mismatch is considered significant if more than ten percent of the power is reflected or lost. For the AC to DC converter 14, the output is DC and therefore the resistances must be equal. A simplified equivalent circuit for the output of an AC to DC converter 14 can be seen in FIG. 8 where $R_O$ is the DC output resistance of the AC to DC converter 14 and $R_L$ is the load 16 resistance. From FIG. 8 and the Maximum Power Transfer Theorem, the maximum power will be delivered from the AC to DC converter 14 to the load 16 when $R_O=R_L$. This condition will therefore be termed the optimal load 16 resistance. It should be noted that the two efficiency losses are linked together. As an example, varying the load 16 resistor not only causes loss due to DC output mismatch, but the change in load 16 resistance also changes the equivalent impedance seen by the source, which causes input mismatch.

The present invention addresses the two efficiency losses previously stated by creating multiple AC to DC paths 22 by use of multiple AC to DC converters 14. The multiple paths allow each path to be optimized for a given characteristic to provide a near optimal performance over a wider range of input parameters.

The present invention can be implemented for a number of different combinations. In a first embodiment, the load 16 is fixed at or near the optimal load 16 resistance, which was described above, and the input power is variable. As stated previously, with proper design the AC to DC converter 14 in FIG. 2 can efficiently drive a fixed load 16 over a limited input power range. This can be seen in FIG. 5. However, if it is desired to efficiently drive the load 16 over a larger input power range than can be provided by the prior art or if it is found to be advantageous in other applications where the load 16 is fixed, the invention can be used. A block diagram of an embodiment of the invention can be seen in FIG. 9, where the AC to DC converter includes a selector, two first impedance matching networks 12, two AC to DC converters 14, and a combiner 20 in communication with an input and a load 16.

As shown in FIG. 9, the input is an AC source with a source impedance, $R_S$, which are initially matched to the equivalent circuit of the selector 18, the AC to DC converters 14 and their associated first impedance matching networks 12, the combiner 20, and the load 16 using the second impedance matching network 24. The first and second impedance matching networks 12, 24 can be, but are not limited to, Pi-, T-, L-, single series element, or single shunt element network that can contain combinations of inductors and capacitors well known to those skilled in the art and described in detail in the books, "Antenna Impedance Matching" by the author Wilfred N. Caron and "The Design of Impedance-Matching Networks for Radio-Frequency and Microwave Amplifiers" by the author Pieter L. D. Abrie, both incorporated by reference herein. It should be noted that the capacitors and inductors used in the first and second impedance matching networks 12, 24 may be discrete elements, elements formed on a substrate such as a Printed circuit board 36 (PCB) or chip, intrinsic elements, or parasitic elements. The output from the second impedance matching network 24 is connected to the selector 18, which directs the signal to the appropriate AC to DC path 22. The selector 18 can be, but is not limited to, a simple hardwired connection, such as a microstrip line, a balanced-unbalanced (balun) transformer, or an active switching circuit such as a transistor, pin diode(s), or relay. Each AC to DC path 22 is matched to a predetermined impedance value, such as 50 ohms for standard antenna types, at different power levels using their respective first impedance matching networks 12 and impedance matching techniques known to those skilled in the art. The output from each AC to DC converter 14 is then combined using the combiner 20, and the combined DC is sent to the load 16. The combiner 20 can be, but is not limited to, a simple hardwired connection such as a microstrip line, discrete components such as diodes, or an active switching circuit such as a transistor, pin diode(s), or relay. The second impedance matching network 24 next to the input may be needed if the two paths interfere with each other, which may be the case if using a passive selector 18 and/or combiner 20 that can be implemented with a directly wired connection. The AC to DC converters 14 that can be used with the invention can be, but are not limited to, a voltage doubler (one or more stages), charge pump, peak detector (series or shunt), bridge rectifier, or other AC rectifying circuits.

Figure 4:
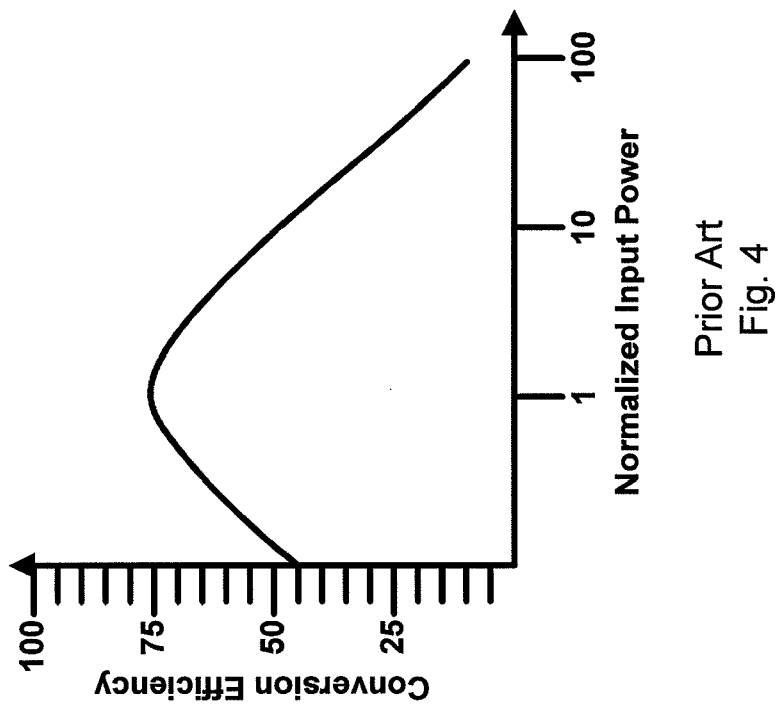
FIG. 4 is a graph of a prior art rectifier efficiency versus normalized input power where the optimal value is normalized to one.

It has been determined through experimentation that the circuit shown in FIG. 2 can efficiently drive the fixed optimal load 16 resistance over a range of −7 to +10 dBm (17 dB range, see FIG. 5) when matched at 0 dBm and designed properly. However, if a range of −20 to +10 dBm is required, the circuit in FIG. 2 will suffer from the effects shown in FIG. 4, and the conversion efficiency will be reduced below 50 percent at the lower power level (less than −7 dBm). The reduction in the conversion efficiency for this case is caused by power reflected at the input to the AC to DC converter 14 in FIG. 2 due to an impedance mismatch. The impedance mismatch is caused by the change in the input power. The AC to DC converter 14 contains nonlinear elements. The nonlinear nature of the elements means their impedance values change with the power level, which will in turn cause an impedance mismatch between the source and the AC to DC converter 14.

A solution to this problem is to use the AC to DC converter 14 in FIG. 9 where the top AC to DC converter 14 is matched at −13 dBm and the bottom AC to DC converter 14 is matched at +0 dBm. The selector 18 can then choose the appropriate path for the input signal depending on the input power level. The top AC to DC converter 14 will be able to drive the fixed optimal load 16 resistance over a 17 dB range as previously stated, meaning it can convert the input AC signal efficiently over the −20 dBm to −3 dBm range. The bottom AC to DC converter 14 can also efficiently convert the input AC signal over a 17 dB range, which means it can convert input signals with power levels from −7 dBm to +10 dBm. The combination of the two AC to DC converters 14 allows the entire AC to DC converting system to accept input power levels from −20 dBm to +10 dBm or a 30 dB power range which is 20 times the range of a single AC to DC converter 14.

It should be noted that the selector 18 may be either active or passive. In the active case, a control unit is used to select the appropriate path for the incoming signal based on the power level or load 16 resistance. If the selector 18 is a passive unit, it can be implemented by, but not limited to, a simple wired connection. In this case, the signal would be supplied to the inputs of both AC to DC converter's 14 first impedance matching networks 12. The signal would split itself with most power choosing the path with the least mismatch at the power level of the input signal.

The combiner 20 may take many different forms depending on the configuration of the rest of the system. As an example, the combiner 20, if active, may be implemented with a switch similar to the one used in the selector 18, if active, and both could be controlled by the same controller or a different controller. In the active case, a control unit is used to select the appropriate path for the incoming signal based on the power level or load 16 resistance. When a passive system is advantageous, the combiner 20 can be implemented with a simple wired connection as long as the output of the unused AC to DC path 22 will not affect the performance or with one or more blocking diodes. An example converter for the passive case for both the selector 18 and combiner 20 is shown in FIG. 10 where the matching has been configured to match the previous example.

A second embodiment for how the invention can be implemented is to have a fixed input power and a variable load 16 resistance, which is shown in FIG. 11.

Figure 3:
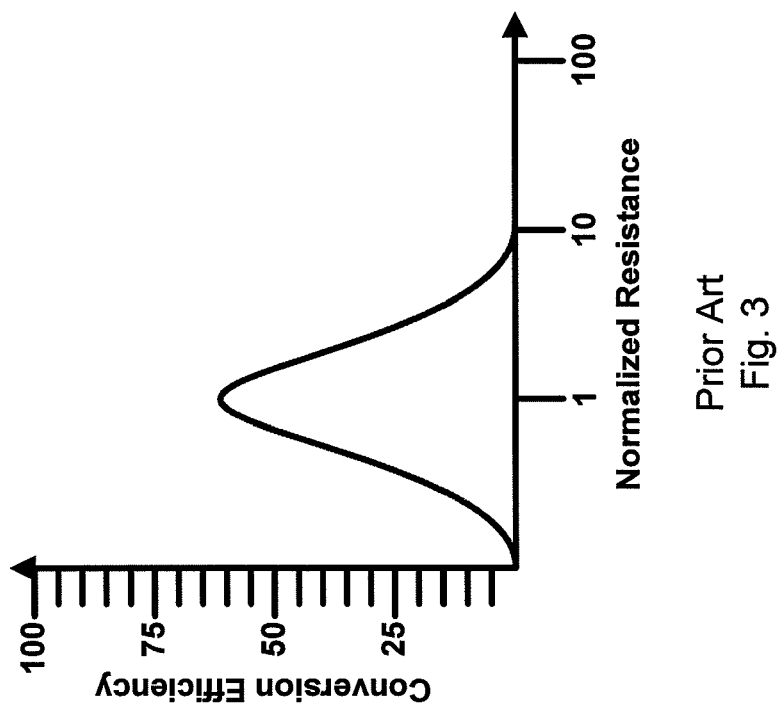
FIG. 3 is a graph of a prior art rectifier efficiency versus normalized load resistance where the optimal value is normalized to one.

In the prior art circuit in FIG. 2, there will be loss described by the Maximum Power Transfer Theorem due to the mismatch of the AC to DC converter 14 output resistance and the load 16 resistance. The corresponding conversion efficiency will be similar to that shown in FIG. 3. The AC to DC converter 14 in FIG. 2 can be matched to loads 16 other than the optimal load 16 resistance to minimize the loss in conversion efficiency caused by input mismatch at that load 16 resistance value. However, there will still be loss in conversion efficiency due to the mismatch between the AC to DC converter 14 output DC resistance and the load 16 resistance and the conversion efficiency will take a shape similar to that shown in FIG. 3. There will also be loss due to impedance mismatch between the impedance of the input and the input of the AC to DC converter 14 caused by the change in the load 16 resistance.

The invention can be used to combat the issue of reduced conversion efficiency by matching the top AC to DC converter 14 in FIG. 11 at or near one discrete resistance that the variable load 16 is at or near for some time. The bottom AC to DC converter 14 in FIG. 11 is matched to a different discrete resistance that the variable load 16 is at or near for some time. This technique will reduce the loss caused by impedance mismatch between the impedance of the input and the input of the AC to DC converter 14 caused by the change in the load 16 resistance as was shown in FIG. 5. However, the loss caused by the mismatch between the AC to DC converter 14 output DC resistance and the load 16 resistance is still present in this case.

In the two previous embodiments, fixed input power/variable load 16 resistance and fixed load 16 resistance/variable input power, an observation can be made; multiple AC to DC converter 14 paths may not be needed if the combiner 20 is put before the AC to DC converter 14 as shown in FIG. 12. This would essentially be switching between the two first impedance matching networks 12 to work with the same AC to DC converter 14. This realization is valid when the selection by the selector 18 and combiner 20 is done with an active element such as a transistor, pin diode, or relay, which would be controlled by a controller. If passive selection is used by a simple wired connection, the realization of using a single AC to DC converter 14 is no longer valid due to the fact that the parallel matching networks will reduce to a single matching network yielding the same problems present in the prior art.

For the passive selection case, an AC to DC converter 14 on each path insures that the AC signal is not present at the output. The lack of AC at the output means the two path outputs will not destructively interfere. The lack of AC at the output is sometimes referred to as destroying the phase. It should be noted that for the active selection case, it may be found advantageous to still include both AC to DC converters 14. However, the AC to DC converters 14 can be reduced to a single AC to DC converter 14 for most applications.

A third and more practical embodiment of how the invention can be implemented is for a variable input power and a variable load 16 resistance, which is shown in FIG. 13.

A realistic situation in AC to DC converting applications, such as RF to DC conversion, is to have a variable input power and a variable load 16 resistance. This situation combines the problems associated with the previous two embodiments (fixed input power/variable load 16 resistance and fixed load 16 resistance/variable input power). These problems are losses caused by input and output impedance mismatch of the AC to DC converter 14. The solution for the input impedance mismatch was presented in the first embodiment, which matched each path at a different power level for the optimal load 16 resistance. The problem with this embodiment is that it was limited to the optimal load 16 resistance. The remaining problem in the first embodiment was the loss caused for non-optimal loads 16 by the resistive mismatch between the output resistance of the AC to DC converter 14 and the resistive load 16. This problem was addressed in the second embodiment by matching each path to a different resistance. The issue with the second embodiment was that it was for a fixed power and power level changes would cause mismatch at the input to the AC to DC converter 14 thus causing the conversion efficiency to be reduced.

Figure 14:
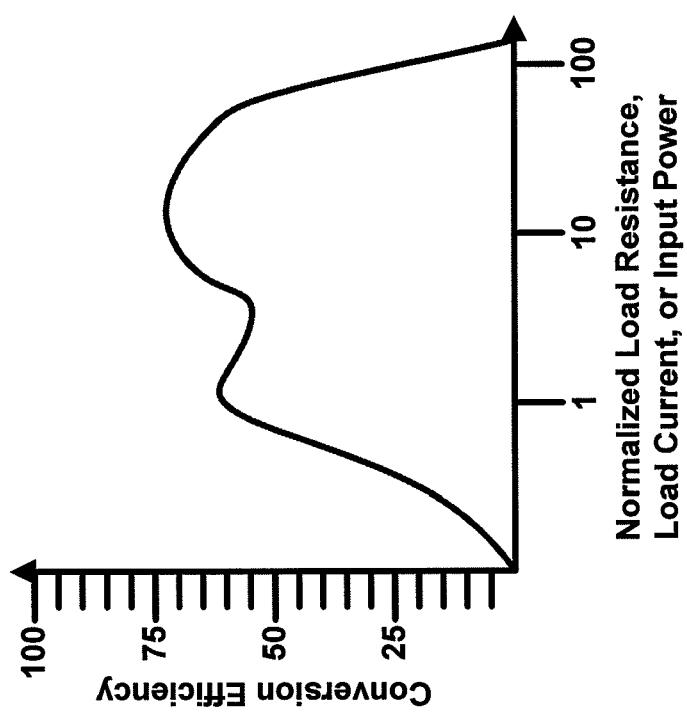
FIG. 14 is a graph of AC to DC efficiency versus normalized load resistance, load current, or input power for the present invention where lowest optimal value is normalized to one.

A solution to the output mismatch loss and the input mismatch loss is to adjust the parameters of the AC to DC converters 14 so they have different output resistance thus enabling the converter to have more than one optimal load 16. In other words, the output resistance varies with input power and/or load 16 resistance. The parameters may be adjusted by using different diodes, transistors, or other non-linear elements or by using different AC to DC topologies. Preferably, different diodes are used wherein at least one diode has a different resistance, impedance, turn-on voltage, junction capacitance, or other characteristic. This technique can then be implemented in conjunction with the method described in the first embodiment, which matched each path at a different power level. The result provides an AC to DC conversion efficiency graph with two peaks unlike the single peak shown in FIG. 3. The resulting graph has a nearly constant conversion efficiency over a wider range of load 16 resistances as shown in FIG. 14.

The technique of multiple AC to DC paths 22 matched at different input power levels with different output resistances works exceptionally well when connecting the converter to a battery 32 for recharging purposes or to an LED for direct powering. The battery 32 or LED equivalent resistance is inversely proportional to the input power to the AC to DC converter 14, which means at low power levels the battery 32 or LED looks like a large resistor while at high power levels the battery 32 or LED looks like a small resistor. This realization allows each path to be optimized for a specific power level and load 16 resistance. As an example, the upper AC to DC path 22 in FIG. 13 could be impedance matched at a high power level and the AC to DC converter 14 in that path could be designed to have a low optimal load 16 resistance. The lower path, on the other hand, could be impedance matched at a low power level and the AC to DC converter 14 in that path could be designed to have a high optimal load 16 resistance. The resulting converter using passive selector 18 and combiner 20 (directly wired) can be seen in FIG. 15.

It should be noted that for battery 32 (or for other storage) charging and applications where circuits or resistive loads are driven directly, it may be necessary to place a voltage monitoring circuit 34 on the output of the combiner 20 to ensure that the voltage level stays within a specified range. The voltage monitoring circuit 34 can include, but is not limited to, over-voltage protection, under-voltage protection, or some combination of the two; regulator; DC to DC converter; or any other circuit that can ensure that the voltage level stays within a specified range. This can be seen in FIG. 16.

Figure 23:
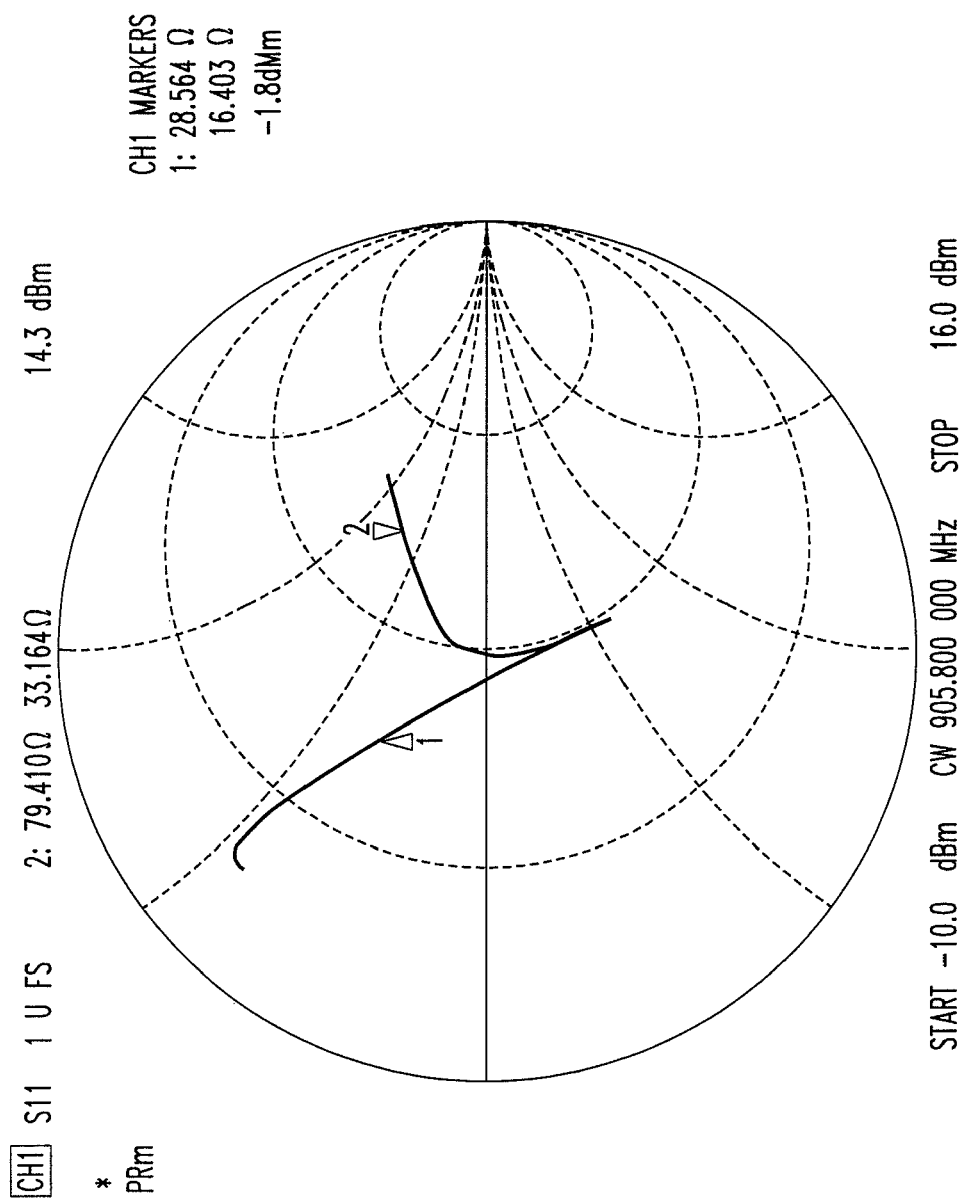
FIG. 23 is a graph of measured input impedance for the embodiment of the invention shown in FIG. 21 for different input power levels at 905.8 MHz.
Figure 24:
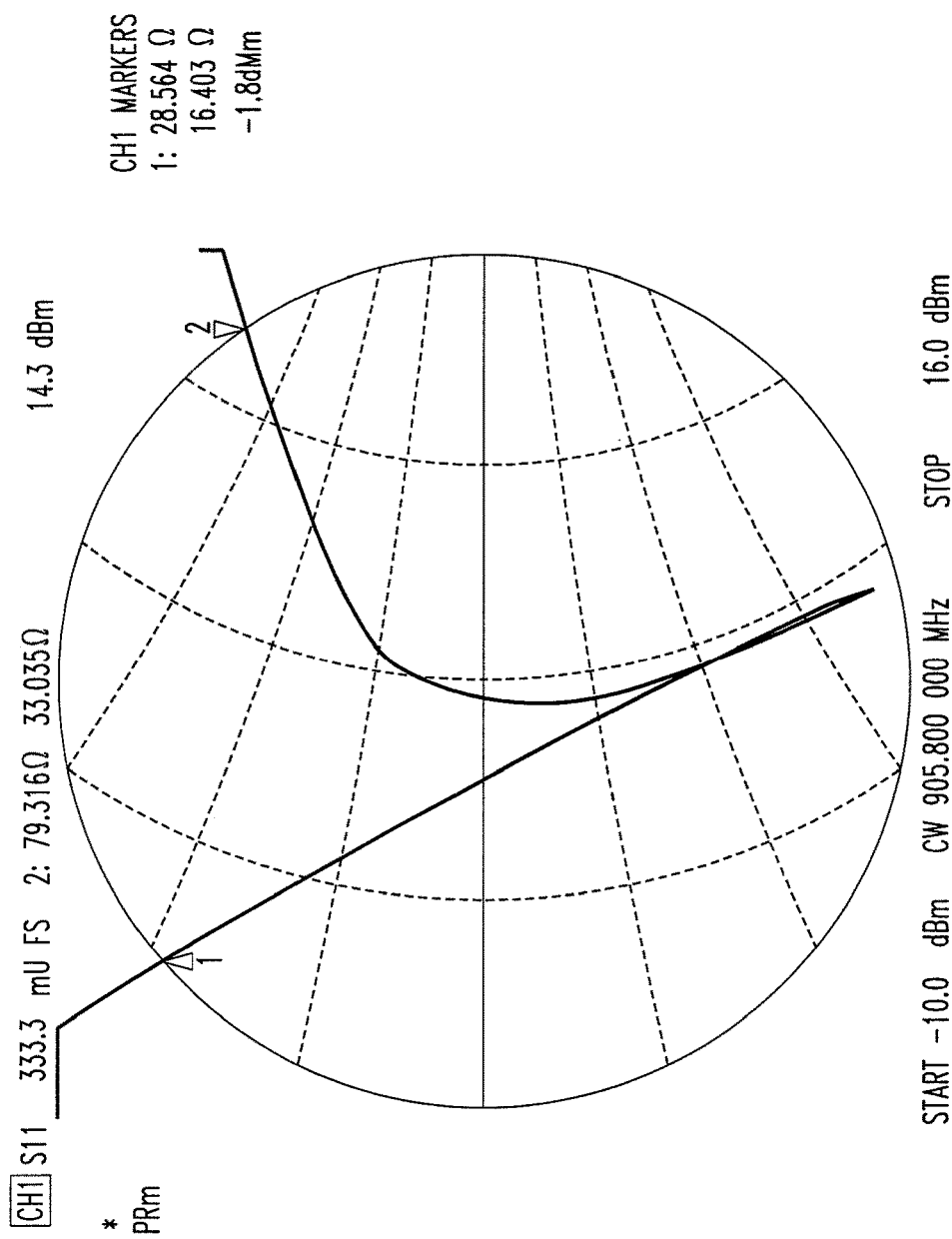
FIG. 24 is a graph of measured input impedance for the embodiment of the invention shown in FIG. 21 for different input power levels at 905.8 MHz wherein impedances within the Smith chart circle correspond to SWR values of less than 2.0.
Figure 26:
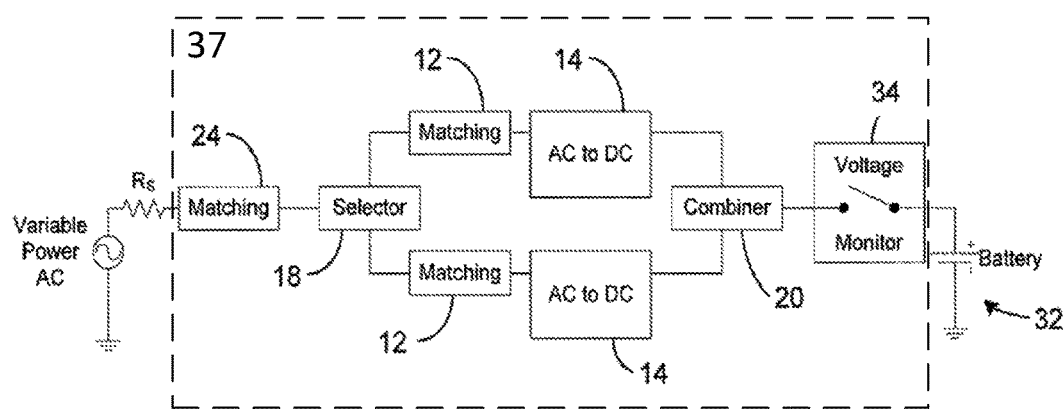
FIG. 26 is a block diagram of an embodiment of the apparatus of the present invention that was fabricated on a chip.

The concepts described herein have been verified in an RF power harvesting application. The converter shown in FIG. 21 was fabricated on a Printed circuit board 36 (PCB), although it is possible to form the converter on a semiconductor or equivalent chip (see, e.g., chip 37 shown in FIG. 26). In the fabricated converter, the AC source and source resistance in the Figure have been implemented with an energy harvesting antenna 48 and the matching and output resistances were designed to drive a 3-volt battery 32. The results of tests showed that the design had a conversion efficiency of over 50 percent over a range from −1 dBm, which can be seen in FIG. 17 and is compared to the prior art, while maintaining a Standing Wave Ratio (SWR) of under 2.0 over almost the entire range for a frequency of 905.8 Mega-Hertz (MHz) and a 3-volt battery 32. The SWR is a measurement that describes how well the equivalent circuit of the AC to DC converter 14 and load 16 resistance is matched to the impedance of the input, which in this case was a 50-ohm antenna 48. FIGS. 22-24 show the SWR data measured using a network analyzer. As is shown in the FIGS., the AC to DC converter had an SWR of less than 2.0 for an input power of −1.82 dBm to 14.3 dBm or a range of over 16 dB. The same is true for a load 16 range of over 16 dB (range covering 40 times a minimum value), that is, the SWR is less than 2.0. An SWR value of 2.0 is approximately a reflection loss of 10 percent.

Figure 17:
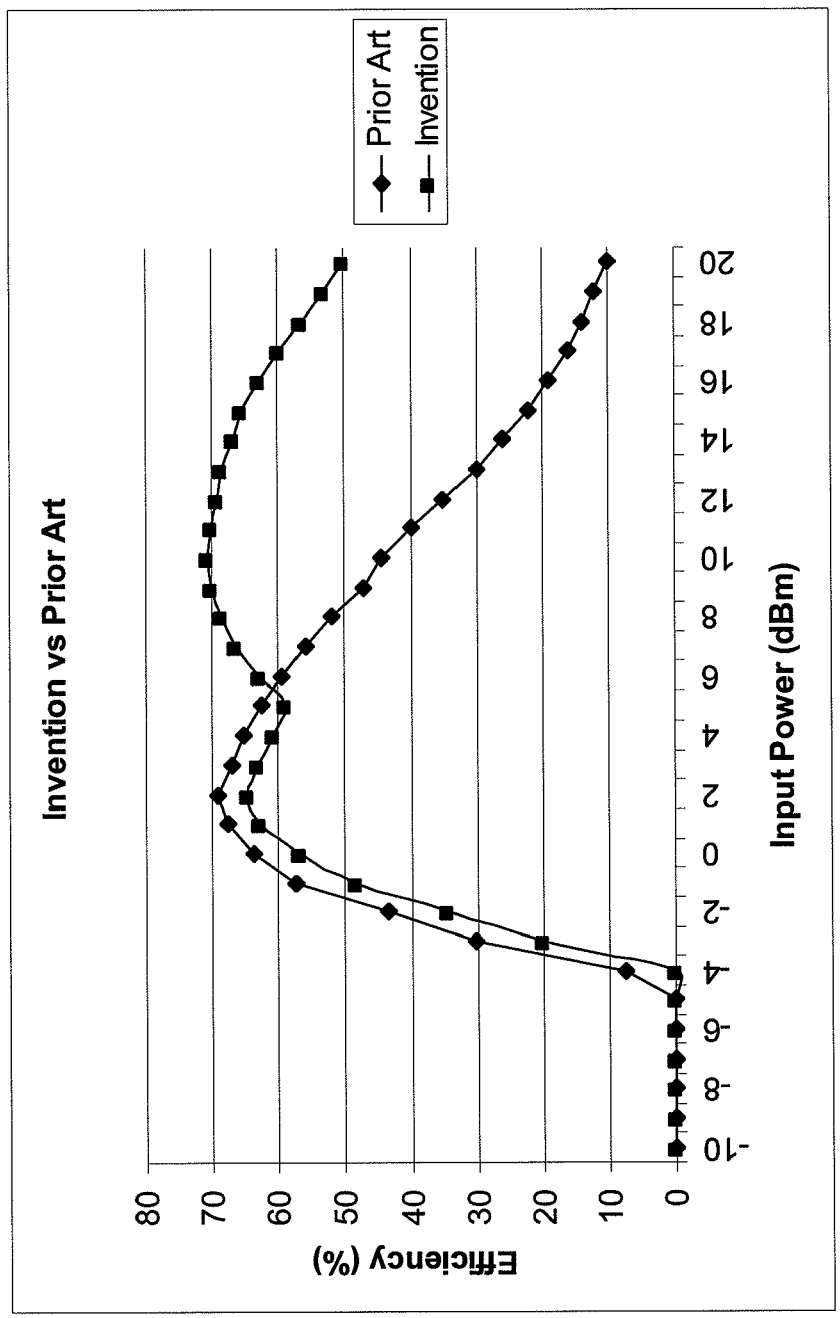
FIG. 17 is a graph of RF to DC conversion efficiency of the present invention compared to the prior art.

It is important to note that in RF power harvesting applications, the power range of the converter, −1 dBm to +20 dBm for this example, can be translated into distance from a powering transmitter. It is well known to those skilled in the art that the power available at a receiving antenna 48 in the far-field is inversely proportional to the square of the distance between the transmitter and receiver. Given this fact and the −1 dBm to +20 dBm power range (where the difference from the lowest power to the highest power is approximately 20 dB or 100 times the lowest power), the distance in which the conversion efficiency is over 50% for this example will be from a distance X to a distance proportional to the square root of the power range, or for this case the square root of 100. Using this example it can be seen that the fabricated converter can convert greater than 50% of the available power from a distance X to a greater distance of 10X where X is determined by the power setting, gain, and algorithm of the powering transmitter. In other words, the conversion efficiency of the invention does not substantially change for changes in distance. It should be noted that the AC to DC conversion efficiency of the invention at a given time is based on the instantaneous power level (power level at that given time) and, therefore, using a transmitter algorithm such as a pulsing algorithm, as disclosed in U.S. Provisional application 60/656,165, and related U.S. patent application Ser. No. 11/356,892, incorporated by reference herein, the invention is able to efficiently convert AC to DC at much lower average input power levels than those depicted in FIG. 17. As an example, if a 0 dBm continuous wave (CW) AC input is supplied to the invention, from FIG. 17, the conversion efficiency will be approximately 57 percent because the peak instantaneous power is 0 dBm. However, if 0 dBm is pulsed at a 25 percent duty cycle, the average power is a fourth of 0 dBm or −6 dBm. According to FIG. 17, the conversion efficiency at −6 dBm is zero percent. However, the use of pulsing means the input power has a peak instantaneous power of 0 dBm during the pulse and therefore the AC to DC conversion efficiency is still approximately 57 percent. As this example shows, the use of pulsing allows the AC to DC conversion efficiency graph in FIG. 17 to be shifted to the lower power levels by adjusting the peak power levels of the pulses to fall within the high efficiency conversion region which for FIG. 17 is −1 to 20 dBm. The average power, however, may be outside the high efficiency conversion region. In RF power harvesting applications, using the pulsing method with the invention allows the AC to DC converter 14 to efficiently convert the RF energy captured by the antenna 48 for the same average power as a CW signal at a much greater distance from the transmitter.

Since light is a form of AC, the technique described herein can also be applied to solar panels and other light to DC converting circuits. The concepts described are still applicable; however, the blocks may not be represented by electrical circuits but rather optical devices such as, but limited to, lens, optical filters, optical fiber, etc. An example for how a solar panel could use the concepts described in the invention can be developed by realization that a solar cell suffers from the same conversion efficiency as described by FIG. 3. There is an optimal value of the solar cell load 16 resistor that produces the maximum output power. The technique described herein could be applied by creating adjacent solar cells with different output resistance to enable the solar panel to have more than one optimal resistive load 16 which allows the solar panel to have a near optimal conversion efficiency across a wider range of load 16 resistances.

As shown with the solar cell example, the invention can be applied to any number of fields such as, but not limited to, rectifying circuits for converting AC to DC in RF power harvesting, piezoelectric power harvesting, solar cells, generators, vibration harvesting, acoustic harvesting, or any other application requiring conversion of AC to DC. As the previous list of applications shows, the invention has numerous implementations in the energy harvesting or power harvesting field. Energy harvesting is defined as capturing energy from the surroundings and converting the captured energy into another form of energy. Captured energy may be specifically created for the purpose of harvesting or be ambient, meaning the energy is from the environment or created for another purpose such as, but not limited to, sunlight and radio communications, respectively. The apparatus 10 that harvests the energy is termed the energy harvester 38 and may include, but is not limited to, an antenna 48, a piezoelectric element 50, a solar cell, a generator, a vibration harvester, an acoustic harvester, a wind harvester, any other element or elements that harvest energy, an AC to DC converter 14, a voltage doubler (one or more stages), charge pump, peak detector (series or shunt), bridge rectifier, other AC rectifying circuits, or the invention.

It should be noted that the embodiments outlined above could be applied to other storage devices such as, but not limited to, a capacitor. The converter could also be designed to directly drive any circuit that runs in more than one mode of operation, such as, but not limited to, a microcontroller that runs in sleep mode and active mode. The equivalent resistance of the microcontroller would be high in sleep mode and low in active mode, giving the need for efficient conversion of AC to DC over more than one resistive load 16.

Figure 18:
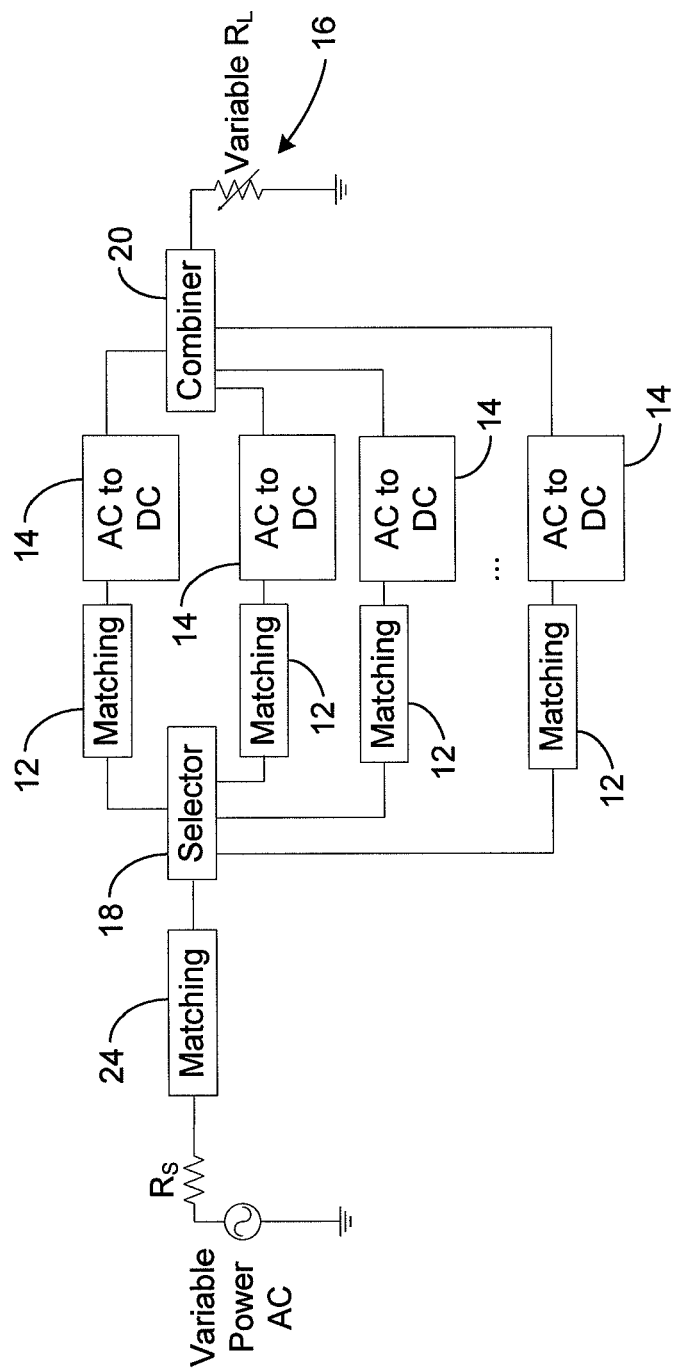
FIG. 18 is a block diagram of multiple paths for conversion.

There may be a need for the converter to have an even wider range of input power levels and/or load 16 resistances. For this circumstance, more than two AC to DC paths 22 could be implemented using the same procedure described in detail herein. An example of this is shown in FIG. 18, where a plurality of AC to DC paths 22 is illustrated.

The invention is designed to be independent of the type of AC to DC converters 14 that can be used. Several AC to DC converters 14 were tested and are known to work with the invention. FIG. 2 shows a voltage doubler from the prior art, which has been tested with the invention. FIG. 19 shows a single diode, full wave rectifier 40 that has been tested and is known to work with the invention. It should be noted that different AC to DC converter 14 topologies, as shown in FIGS. 2, 19, and 20, may be used within the invention to produce a desired effect.

FIG. 20 shows a single diode, half wave rectifier 42 that has been tested and is known to work with the invention. The invention will work with any other AC rectifying circuits.

Figure 21:
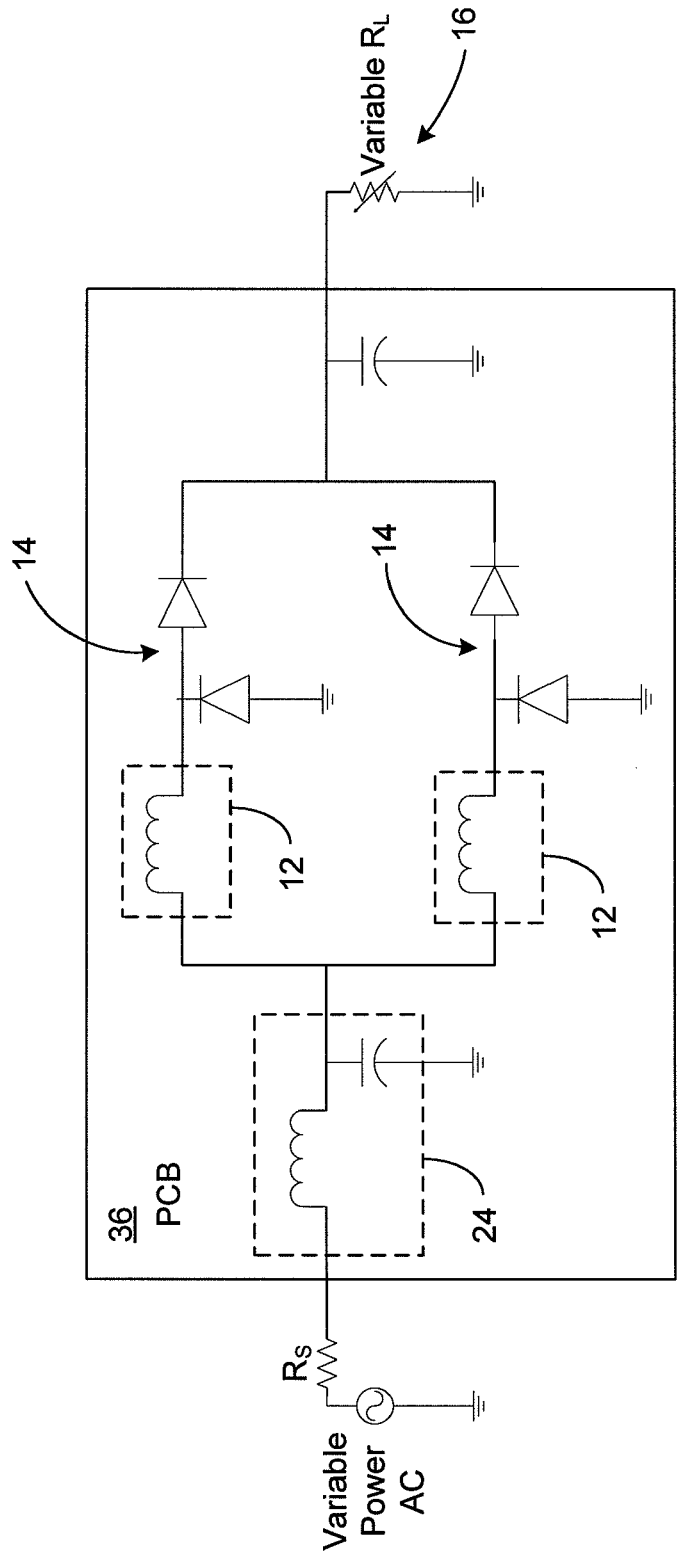
FIG. 21 is a block diagram of an embodiment of the apparatus of the present invention that was fabricated on a printed circuit board.
Figure 22:
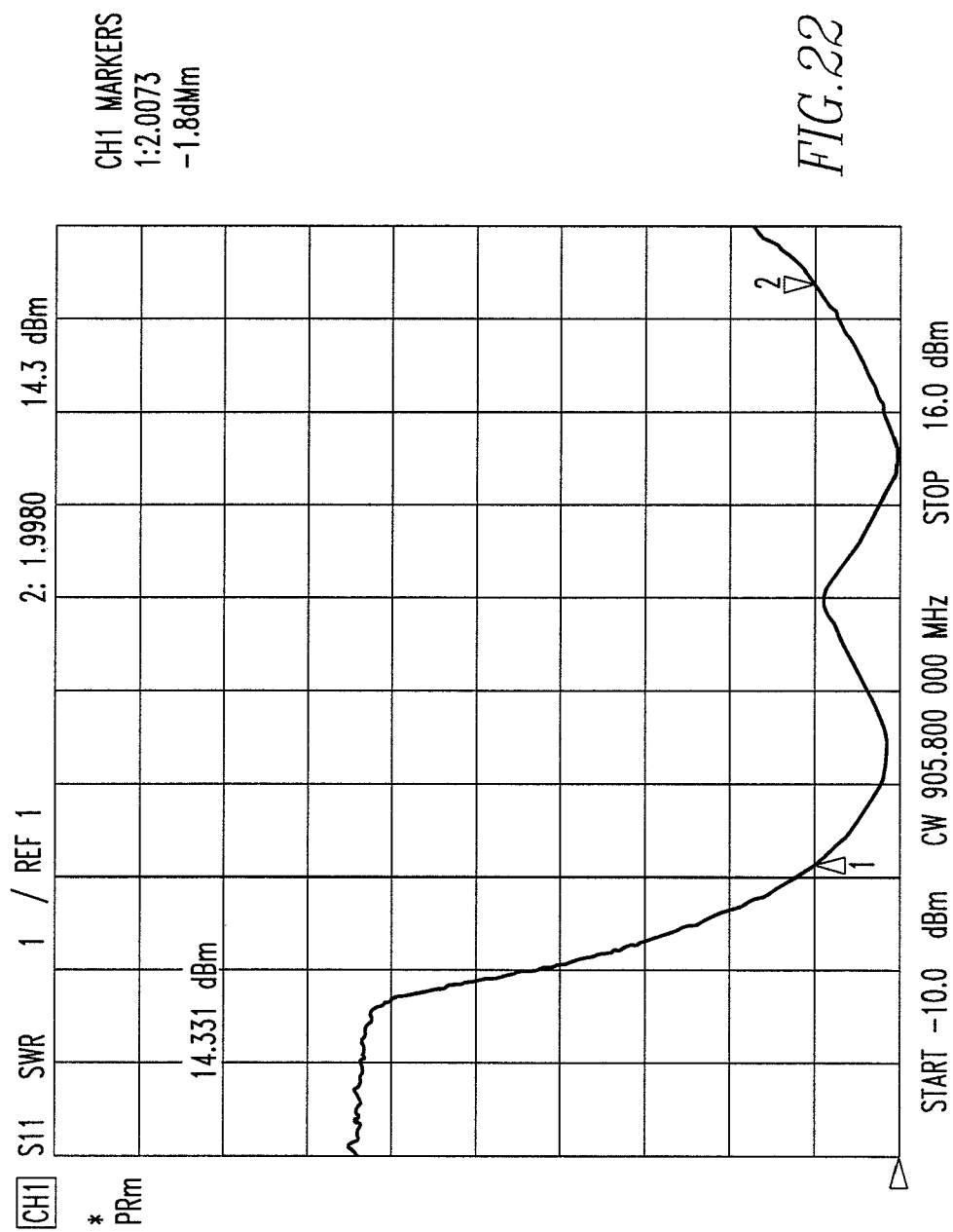
FIG. 22 is a graph of measured input SWR data for the embodiment of the invention shown in FIG. 21 for different input power levels at 905.8 MHz.

FIG. 22 is a graph of measured input SWR data for the embodiment of the invention shown in FIG. 21 for different input power levels at 905.8 MHz.

FIG. 23 is a graph of measured input impedance for the embodiment of the invention shown in FIG. 21 for different input power levels at 905.8 MHz.

FIG. 24 is a graph of measured input impedance for the embodiment of the invention shown in FIG. 21 for different input power levels at 905.8 MHz wherein impedances within the Smith chart circle correspond to SWR values of less than 2.0.

FIG. 13 is a block diagram of the present invention with a variable load and a variable input power. The apparatus shown in FIG. 13 includes a variable AC power source having source impedance $R_S$, impedance matching network 24, selector 18, the upper AC to DC path including impedance matching network 12 and AC to DC converter 14, the lower AC to DC path including impedance matching network 12 and AC to DC converter 14, combiner 20 and load 16 having variable load resistance $R_L$. The apparatus shown in FIG. 13 can convert AC power from the variable AC power source to direct current to power load 16 with improved efficiency over a wide range of input power and load resistance $R_L$.

Variable AC power source can include an antenna, a piezoelectric element, a generator, a vibration harvester, an acoustic harvester, or a wind harvester. The source impedance $R_S$ of the variable AC power source is initially matched to the equivalent circuit of selector 18, AC to DC converters 14 and associated impedance matching networks 12, combiner 20, and variable load resistance $R_L$ 16 using the second impedance matching network 24. The impedance matching networks 12 and 24 can be, for example, Pi-, T-, L-, single-series element, or single-shunt element impedance matching network that can contain combinations of inductors and capacitors.

Selector 18 may be either active or passive. If the selector 18 is active, a control unit can be used to select the appropriate path (i.e., the upper AC to DC path or the lower AC to DC path) for the incoming signal based on, for example, a power level or variable load resistance $R_L$ and the incoming signal can propagate along that path. If the selector 18 is passive, selector 18 can be implemented by, for example, a simple wired connection. In the passive case, the signal can be supplied to impedance matching network 12 of each of the upper AC to DC path and the lower AC to DC path. The signal divides and most of the power from the signal propagates along the path with the least mismatch (i.e., impedance mismatch) at the power level of the input signal.

AC to DC converters 14 can be, for example, a voltage doubler having one or more stages, a charge pump, a series peak detector, a shunt peak detector, a bridge rectifier, and/or other AC rectifying circuits. Each of AC to DC converter 14 of the upper AC to DC path and AC to DC converter 14 of the lower AC to DC path can be matched to a predetermined impedance value, such as 50 ohms, at different power levels using the respective impedance matching networks 12. That is, AC to DC converter 14 of the upper AC to DC path can be matched to an impedance value of 50 ohms at one power level using impedance network 12 of the upper AC to DC path, and AC to DC converter 14 of the lower AC to DC path can be matched to an impedance value of 50 ohms at a different power level using impedance network 12 of the lower AC to DC path.

The DC output from AC to DC converter 14 of the upper AC to DC path is then combined with the DC output from AC to DC converter 14 of the lower AC to DC path using combiner 20. The DC combined output is sent to variable load 16. Combiner 20 can be, for example, a simple hard-wired connection such as a microstrip line, discrete components such as diodes, or an active switching circuit such as a transistor, pin diode(s), or relay. Impedance matching network 24 can be included to prevent or mitigate interference between the upper AC to DC path and the lower AC to DC path. For example, use of a passive (e.g., a directly wired connection) selector at selector 18 and/or passive combiner at combiner 20 can result in interference between the upper AC to DC path and the lower AC to DC path.

The upper AC to DC path and the lower AC to DC path mitigate efficiency losses by creating multiple AC to DC paths by use of multiple AC to DC converters 14. The multiple AC to DC paths allow each path to be optimized for a given characteristic (e.g., different input power levels, different impedances, and/or different load resistances) to provide a near optimal performance over a wider range of input parameters.

Additionally, AC to DC converters 14 can be adjusted or configured to have different output resistances to mitigate output impedance mismatches between AC to DC converters 14 and load 16 to enable the apparatus to operate optimally at more than one output or load resistance. The output resistance of AC to DC converters 14 can be adjusted to operate optimally at (i.e., have a matched impedance with) more than one output or load resistance by using different diodes, transistors, or other non-linear elements at AC to DC converters 14 of the upper AC to DC path and the lower AC to DC path, or by using different AC to DC topologies within the upper AC to DC path and the lower AC to DC path. In other words, the output resistances of the AC to DC converters 14 can vary with input power and/or variable load resistance $R_L$ to reduce impedance mismatches between AC to DC converters 14 and load 16. Diodes having different parameters or characteristics such as different resistance, impedance, turn-on voltage, junction capacitance, or other characteristic at AC to DC converters 14 of the upper AC to DC path and the lower AC to DC path can be used to vary the output resistances of the AC to DC converters 14.

The upper AC to DC path and the lower AC to DC path can be used together with AC to DC converters adjustable to have different output resistances to, for example, combine input impedance matching at different power levels with output impedance matching for improved AC to DC conversion efficiency. The result provides an AC to DC conversion efficiency graph with two peaks (each corresponding to one of the upper AC to DC path and the lower AC to DC path) unlike the single peak of the prior art shown in FIG. 3. The resulting graph has a nearly constant conversion efficiency over a wider range of load 16 resistances as shown in FIG. 14.

Furthermore, the conversion efficiency is nearly constant over a wider range of input power as shown in FIG. 17. In some embodiments, the apparatus shown in FIG. 13 is implemented as an RF power harvester. Because input power is dependent upon distance from a powering transmitter in such applications, the nearly constant conversion efficiency over a wider range of input power means that the apparatus converts harvested power efficiently over a wider range of distances from the powering transmitter.

The technique of multiple AC to DC paths matched at different input power levels with different output resistances works exceptionally well when connecting the apparatus shown in FIG. 13 to a battery for recharging purposes or to an LED for direct powering (e.g., load 16 is replaced with a battery or LED). The battery or LED equivalent resistance is inversely proportional to the input power to the AC to DC converter, which means at low power levels the battery or LED looks like a large resistor while at high power levels the battery or LED looks like a small resistor. This realization allows each path to be optimized for a specific power level and load resistance at the battery or LED. As an example, the upper AC to DC path in FIG. 13 could be impedance matched at a high power level and AC to DC converter 14 in that path could be designed to have a low optimal load resistance. The lower path could be impedance matched at a low power level and AC to DC converter 14 in that path could be designed to have a high optimal load resistance. The resulting converter using passive selector and passive (e.g., directly wired) combiner is shown in FIG. 15.

It will be understood by those skilled in the art that while the foregoing description sets forth in detail preferred embodiments of the present invention, modifications, additions, and changes might be made thereto without departing from the spirit and scope of the invention.

What is claimed is:

1. An apparatus, comprising:
    at least one impedance matching network configured to receive an input signal;
    at least one AC-to-DC converter electrically connected to the at least one impedance matching network, the at least one AC-to-DC converter configured to receive an output of the at least one impedance matching network; and
    a DC-to-DC converter operatively coupled to the at least one AC-to-DC converter, the DC-to-DC converter configured to receive an output of the at least one AC-to-DC converter and regulate a voltage level of the output of the at least one AC-to-DC converter such that a voltage level of an output of the DC-to-DC converter remains within a predetermined voltage range.

2. The apparatus of claim 1, wherein the DC-to-DC converter is configured to be operatively coupled to a load, the DC-to-DC converter configured to provide the output of the DC-to-DC converter to the load when the voltage level of the output of the at least one AC-to-DC converter is within the predetermined voltage range.

3. The apparatus of claim 2, wherein the load is an LED.

4. The apparatus of claim 1, wherein the DC-to-DC converter is configured to be operatively coupled to a load, the DC-to-DC converter configured to prevent the output of the DC-to-DC converter from being provided to the load when the voltage level of the output of the at least one AC-to-DC converter is outside the predetermined voltage range.

5. The apparatus of claim 1, wherein the at least one impedance matching network includes at least one of a discrete element, an intrinsic element, or a parasitic element.

6. The apparatus of claim 1, wherein the at least one AC-to-DC converter includes a first AC-to-DC converter and a second AC-to-DC converter, the apparatus further comprising:
    a switch electrically connected to the first AC-to-DC converter, the second AC-to-DC converter and the DC-to-DC converter, the switch configured to provide an output of the first AC-to-DC converter to the DC-to-DC converter when the switch selects the first AC-to-DC converter, the switch configured to provide an output of the second AC-to-DC converter to the DC-to-DC converter when the switch selects the second AC-to-DC converter.

7. The apparatus of claim 1, wherein the at least one impedance matching network includes a first impedance matching network and a second impedance matching network, the apparatus further comprising:
    a selector operatively coupled to the first impedance matching network and the second impedance matching network, and configured to receive the input signal, the selector configured to direct the input signal to the first impedance matching network when the input signal has a power level within a first power range, the selector configured to direct the input signal to the second impedance matching network when the input signal has a power level within a second power range mutually exclusive from the first power range.

8. The apparatus of claim 7, wherein the selector includes a transistor.

9. The apparatus of claim 1, wherein, during operation of the apparatus, at least two resonances occur with an SWR (standing wave ratio) of less than 2.0.

10. The apparatus of claim 1, wherein the at least one AC-to-DC converter includes a first AC-to-DC converter and a second AC-to-DC converter, the apparatus further comprising:
    a combiner electrically coupled to the first AC-to-DC converter and the second AC-to-DC converter, the combiner configured to combine an output of the first AC-to-DC converter with an output of the second AC-to-DC converter to produce a combined output,
    the DC-to-DC converter configured to regulate a voltage level of the combined output such that the voltage level of the combined output remains within the predetermined voltage range.

11. The apparatus of claim 10, wherein the combiner is a switch.

12. An apparatus, comprising:
    a microchip;
    at least one impedance matching network configured to receive an input signal;
    at least one AC-to-DC converter formed on the microchip and electrically connected to the at least one impedance matching network, the at least one AC-to-DC converter configured to receive an output of the at least one impedance matching network; and
    a DC-to-DC converter formed on the microchip and operatively coupled to the at least one AC-to-DC converter, the DC-to-DC converter configured to receive an output of the at least one AC-to-DC converter and regulate a voltage level of the output of the at least one AC-to-DC converter such that the DC-to-DC converter maintains an output voltage within a predetermined voltage range.

13. The apparatus of claim 12, wherein the at least one impedance matching network is connected to the microchip.

14. The apparatus of claim 12, further comprising:
an antenna operatively coupled to the at least one impedance matching network, the antenna configured to wirelessly receive RF energy and to produce the input signal.

15. The apparatus of claim 12, wherein the at least one impedance matching network includes a first impedance matching network and a second impedance matching network, the apparatus further comprising:
a selector formed on the microchip and operatively coupled to the first impedance matching network and the second impedance matching network, the selector configured to receive the input signal, the selector configured to direct the input signal to the first impedance matching network when the input signal has a power level within a first power range, the selector configured to direct the input signal to the second impedance matching network when the input signal has a power level within a second power range mutually exclusive from the first power range.

16. The apparatus of claim 12, wherein, during operation of the apparatus, at least two resonances occur with an SWR (standing wave ratio) of less than 2.0.

17. The apparatus of claim 12, wherein the at least one AC-to-DC converter includes a first AC-to-DC converter and a second AC-to-DC converter, the apparatus further comprising:
a combiner formed on the microchip and electrically coupled to the first AC-to-DC converter and the second AC-to-DC converter, the combiner configured to combine an output of the first AC-to-DC converter with an output of the second AC-to-DC converter to produce a combined output,
the DC-to-DC converter configured to regulate a voltage level of the combined output such that the voltage level of the combined output remains within the predetermined voltage range.

18. The apparatus of claim 12, wherein:
the at least one AC-to-DC converter includes a first AC-to-DC converter and a second AC-to-DC converter,
the first AC-to-DC converter defining a first signal path configured to receive a first output of the at least one impedance matching network having a power level within a first power range,
the second AC-to-DC converter defining a second signal path configured to receive a second output of the at least one impedance matching network having a power level within a second power range different from the first power range.

19. The apparatus of claim 18, wherein the first signal path is substantially matched to a first predetermined impedance value, the second signal path is substantially matched to a second predetermined impedance value different from the first predetermined impedance value.

20. The apparatus of claim 12, wherein the DC-to-DC converter is configured to be operatively coupled to an LED, the DC-to-DC converter configured to provide the output of the DC-to-DC converter to the LED when the voltage level of the output of the at least one AC-to-DC converter is within the predetermined voltage range.

* * * * *